(12) United States Patent
Akamatsu et al.

(10) Patent No.: US 6,251,718 B1
(45) Date of Patent: *Jun. 26, 2001

(54) METHOD FOR MANUFACTURING SEMICONDUCTOR DEVICE

(75) Inventors: Kaori Akamatsu; Shinji Odanaka, both of Hirakata; Hiroyuki Umimoto, Takarazuka, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/011,891
(22) PCT Filed: Jun. 24, 1997
(86) PCT No.: PCT/JP97/02184
  § 371 Date: Feb. 23, 1998
  § 102(e) Date: Feb. 23, 1998
(87) PCT Pub. No.: WO97/50115
  PCT Pub. Date: Dec. 31, 1997

(30) Foreign Application Priority Data

Jun. 24, 1996 (JP) .................................................. 8-162638
Dec. 11, 1996 (JP) .................................................. 8-330517

(51) Int. Cl.[7] .............................................. H01L 21/8238
(52) U.S. Cl. .......................... 438/217; 438/289; 438/305; 438/308; 438/527
(58) Field of Search .................................... 438/514, 527, 438/288, 217, 289, 305, 308

(56) References Cited

U.S. PATENT DOCUMENTS

| 5,160,996 | 11/1992 | Odanaka . |
| 5,283,200 | 2/1994 | Okamoto . |
| 5,393,683 | * 2/1995 | Mathews et al. . |
| 5,474,940 | * 12/1995 | Tsukamoto . |
| 5,559,050 | 9/1996 | Alsmeier et al. . |
| 5,898,007 | * 4/1999 | Lee ........................................ 438/514 |

FOREIGN PATENT DOCUMENTS

| 0 707 346 | 4/1996 | (EP) . |
| 55-83251 | 6/1980 | (JP) . |
| 55-107236 | 8/1980 | (JP) . |
| 63-124519 | 5/1988 | (JP) . |
| 2-264464 | 10/1990 | (JP) . |
| 3-93264 | 4/1991 | (JP) . |

(List continued on next page.)

OTHER PUBLICATIONS

J. Nulman et al., "Electrical Characteristics of Thin Gate Implanted MOS Channels Grown by Rapid Thermal Processing", *IEEE*, pp. 376–379, 1985.

(List continued on next page.)

Primary Examiner—Long Pham
(74) Attorney, Agent, or Firm—Ratner & Prestia

(57) ABSTRACT

A method for producing a semiconductor device includes the steps of: forming an impurity diffusion layer for controlling a threshold voltage by ion implantation; and conducting a high-temperature rapid heat treatment for recovering crystal defects generated by the ion implantation. More specifically, treatment conditions for the high-temperature rapid heat treatment are set in such a manner that interstitial atoms causing the crystal defects are diffused, and impurities in the impurity diffusion layer are not diffused. For example, the high-temperature rapid heat treatment is conducted in a temperature range of about 900° C. to about 1100° C.

20 Claims, 20 Drawing Sheets

FOREIGN PATENT DOCUMENTS

| | | |
|---|---|---|
| 3-165554 | 7/1991 | (JP) . |
| 4-92466 | 3/1992 | (JP) . |
| 6-45328 | 2/1994 | (JP) . |
| 6-53157 | 2/1994 | (JP) . |
| 6-77155 | 3/1994 | (JP) . |
| 7-183393 | 7/1995 | (JP) . |
| 8-46199 | 2/1996 | (JP) . |
| 8-97378 | 4/1996 | (JP) . |

OTHER PUBLICATIONS

Atsuki Ono et al., "Boron enhanced diffusion due to high energy ion–implantation and its suppression by using RTA process", *Mat. Res. Soc. Symp. Proc.,* vol. 354, pp. 319–324, 1995.

T. Uchida et al., "Dopant Redistribution During Gate Oxidation Including Transient Enhanced Diffusion in Oxidizing Ambient", IEDM, pp. 795–798, 1996.

K. Suzuki et al., "Analytical Models for Transient Diffusion and Activation of Ion–Implanted Boron During Rapid Thermal Annealing Considering Ramp–Up Period", IEDM, pp. 799–802, 1996.

J. A. Mandelman, "Anomalous Narrow Channel Effect in Trench–Isolated Buried–Channel P–MOSFET's", IEEE Electron Device Letters, vol. 15, No. 12, pp. 496–498, 1994.

G. G. Shahidi et al., "Indium Channel Implant for Improved Short–Channel Behavior of Submicrometer NMOSFET's", IEEE Electron Device Letters, vol. 14, No.8, pp. 409–411, 1993.

International Search Report for PCT/JP97/02184 dated Oct. 14, 1997.

European Search Report dated Aug. 23, 2000 for EP 97 92 7452.

S. Saito et al., "Evaluation and control of defects, formed by keV–MeV implantation", Nuclear Instruments and Methods in Physics Research B 120 (1966), pp. 37–42.

M. H. Juang et al., "Suppression of anomalous diffusion of ion–implanted boron in silicon by laser processing", Journal of Applied Physics, Apr. 1, 1992, pp. 3628–3630.

L. Yonghong et al., "HVEM observation of defects in rapid thermal annealed implanted silicon", Proceedings of The International Conference on Materials and Process Characterization for VLSI, 1988, pp. 17–20.

* cited by examiner

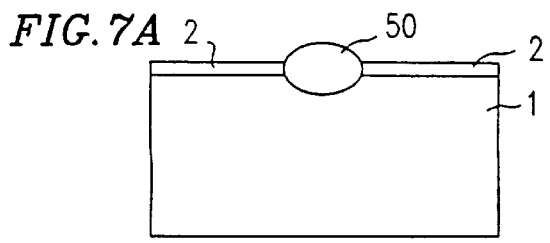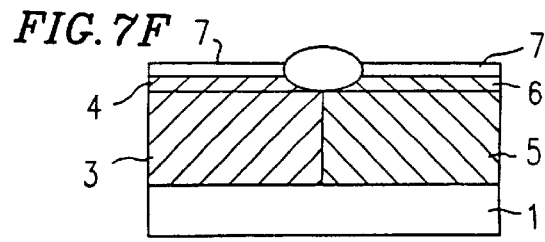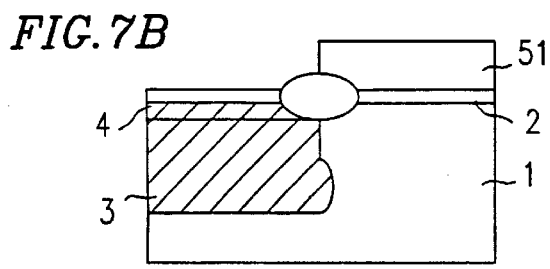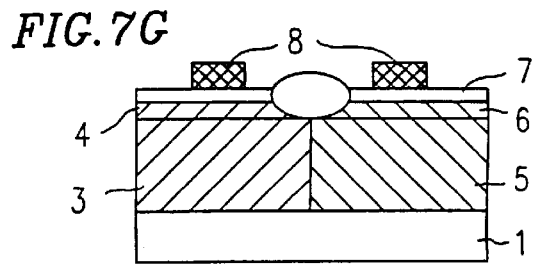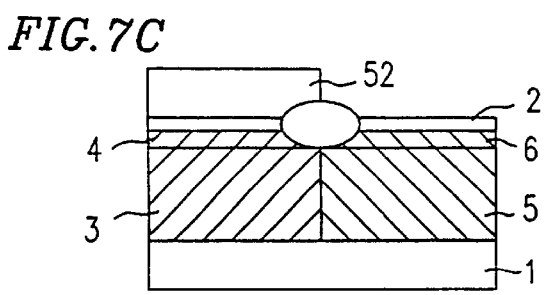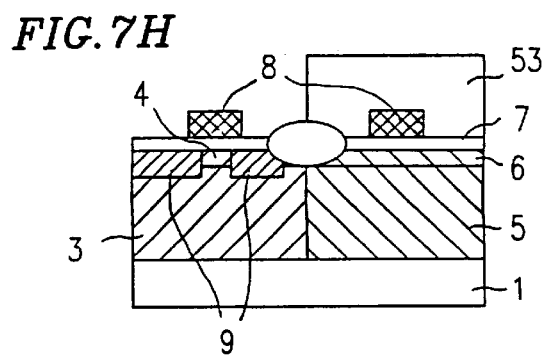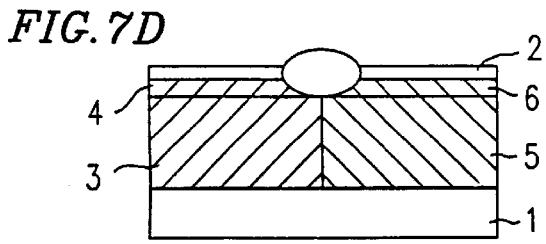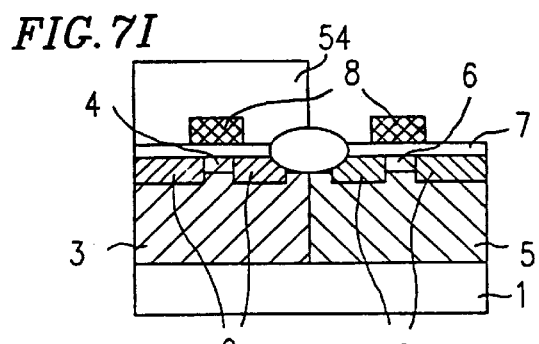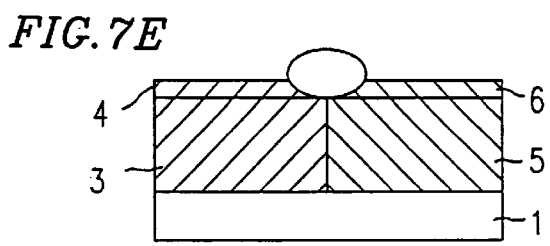

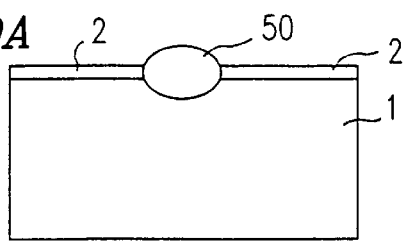
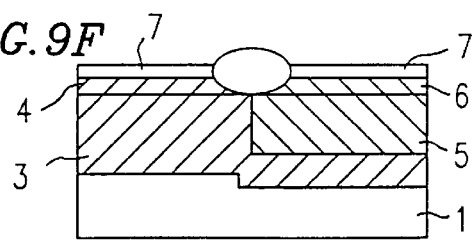
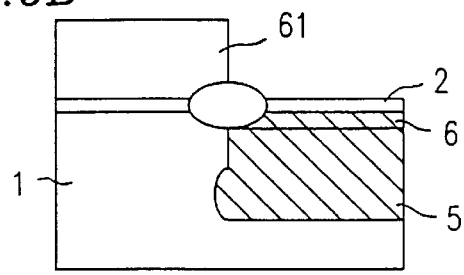
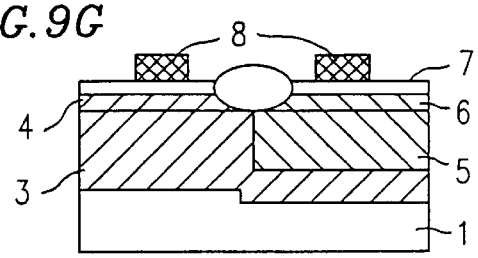
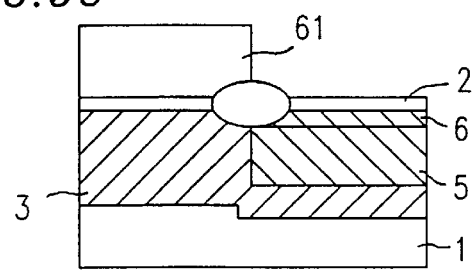
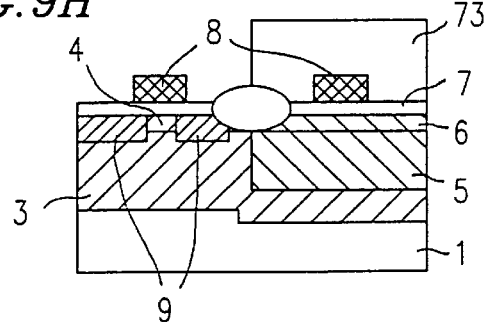
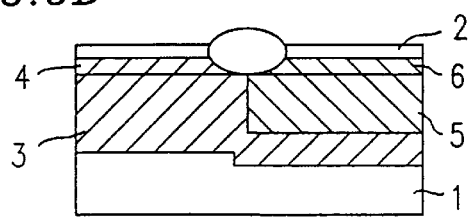
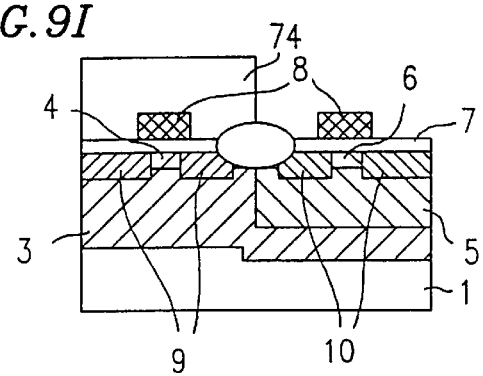
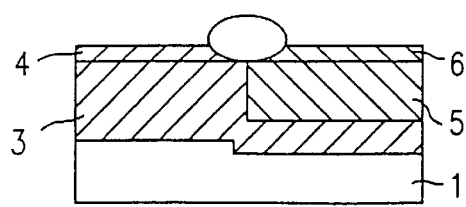

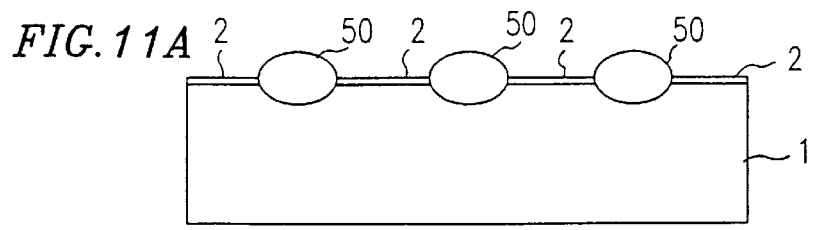
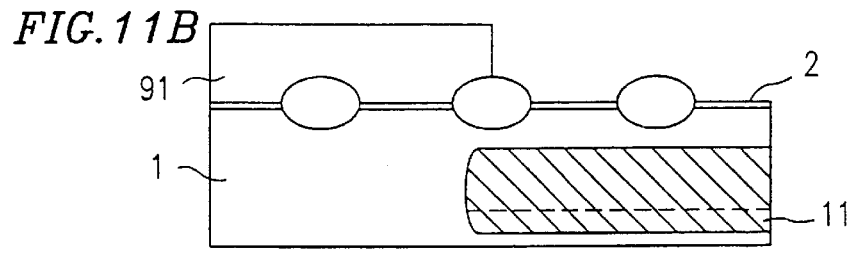
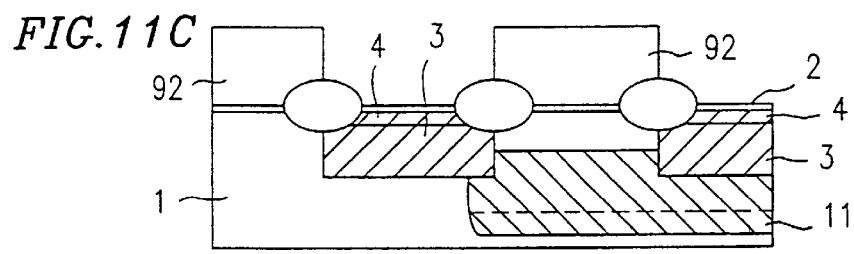
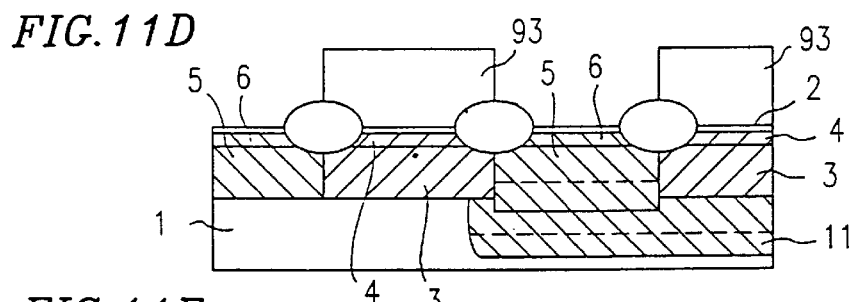
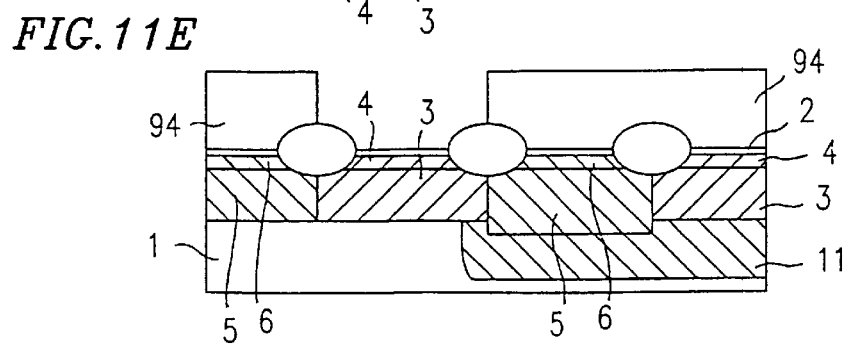
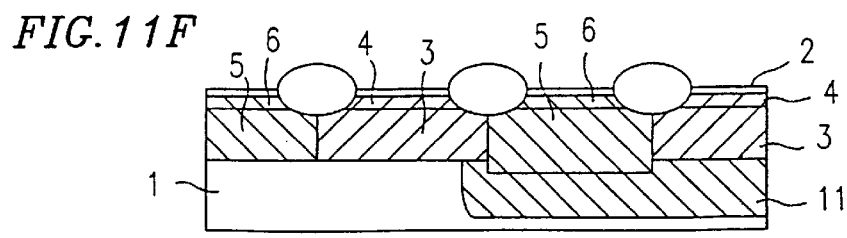

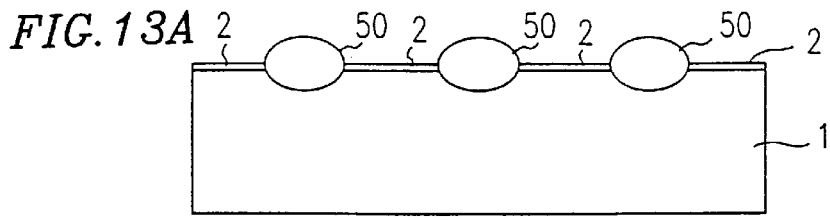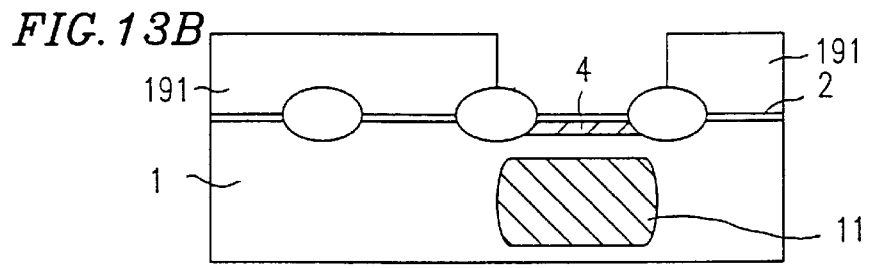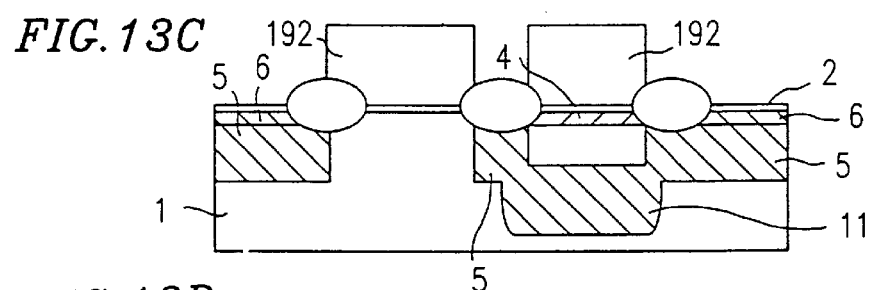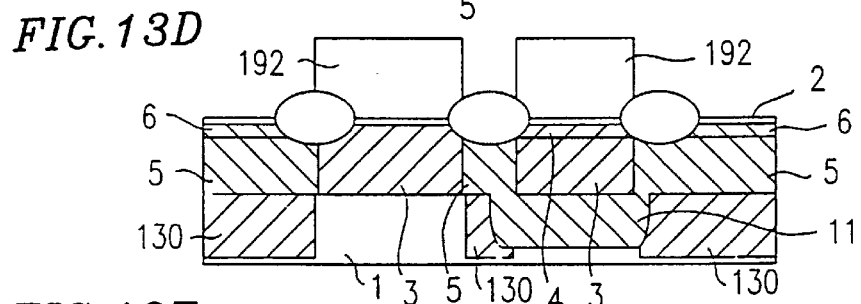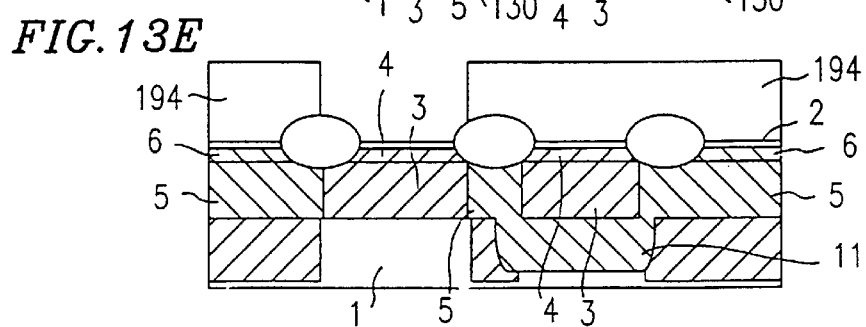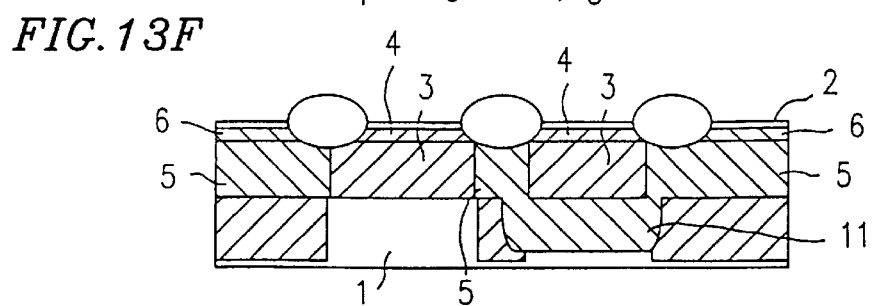

METHOD FOR MANUFACTURING SEMICONDUCTOR DEVICE

This Application is a U.S. National Phase Application of PCT International Application PCT/JP97/02184.

TECHNICAL FIELD

The present invention relates to a method for producing a semiconductor device, which simplifies a production process becoming complicated with the miniaturization of a complementary semiconductor device, and is capable of forming a semiconductor device which stably realizes a high-performance operation.

BACKGROUND ART

In a very large scale integrated circuit (VLSI), there has been a demand for realizing a CMOS technique capable of stably realizing high-performance transistor characteristics. However, with the miniaturization of a device and the decrease in temperature for conducting a production process, etc., point defects, i.e., vacancy and interstitial atoms (e.g., interstitial silicon), which are generated in a large number in a semiconductor substrate during an ion implantation step such as high-energy ion implantation conducted while a well and a buried layer are formed, may cause accelerating diffusion of channel impurities for controlling a threshold voltage, during a heat treatment step conducted later, which may adversely affect the re-distribution of the impurities. More specifically, undesirable problems arise, such as the fluctuations in threshold voltage, the increase in short channel effect at a time of setting a low threshold voltage, an increase in junction capacitance, a deterioration of mobility of carriers on the surface of a substrate, or a deterioration of operational performance involved therein.

In order to solve these undesirable problems, the addition of a heat treatment step for diffusing or eliminating the point defects generated by the implantation of high-energy ions, and the production process for changing a dopant used for controlling a threshold voltage into atoms which are very difficult to diffuse such as indium and antimony have been proposed.

Hereinafter, the outline of various production processes which have been proposed will be described together with problems associated therewith.

It is disclosed by J. A. Mandelman et al. in IEEE ED-L, Vol. 15, No. 12, Dec. 1994 that in a buried channel-type p-MOSFET having a shallow trench separation, the dependence of a threshold voltage on a channel width varies depending upon whether or not a heat treatment step is conducted after forming a well by high-energy ion implantation. More specifically, the following is reported in the above-mentioned reference: in a buried channel-type p-MOSFET having a trench separation, the gradient of the concentration of interstitial silicon generated during high-energy ion implantation for forming a well appears in the vicinity of an oxide film on a trench side wall; as a result, the diffusion of boron forming an impurity layer for controlling a threshold voltage is suppressed more in the vicinity of the side wall of the oxide film than at a center of a channel; and the boron concentration locally increases in the vicinity of the separation side wall to cause a reverse narrow effect in which a threshold value decreases with the decrease in channel width. Considering the above, a production process for overcoming the problems associated with the above-mentioned phenomenon has been proposed.

More specifically, a trench insulation separating layer is formed on a semiconductor substrate, and ions with a first conductivity are implanted into the semiconductor substrate at a high energy (e.g., phosphorus ions are implanted at an acceleration voltage of 500 keV and a dose amount of $2.5 \times 10^{12}$ cm$^{-2}$), whereby an n-well is formed. Then, in order to diffuse point defects generated by high-energy ion implantation, a heat treatment is conducted at a temperature of 800° C. for 60 minutes. Then, ions with a second conductivity are implanted at a low energy into the resultant semiconductor substrate in which the point defects are evenly distributed, whereby a channel impurity distribution for controlling a threshold voltage is formed. Thereafter, in a similar manner to that of a general process for forming a MOSFET, a gate is formed and source/drain are formed using the gate as a mask. Thus, an extraordinarily narrow channel effect is suppressed.

In IEEE ED-L, Vol. 14, No. 8, August 1993, pp. 409–411, G. C. Shahidi et al. have proposed a production process using indium which is implanted at an acceleration energy of 190 keV as a dopant for controlling a threshold voltage. Indium is very difficult to diffuse, and forms a surface channel impurity distribution holding a retrograde shape obtained immediately after implantation, independent of the content of the step conducted before and after the ion implantation step. Therefore, a short channel effect can be suppressed even when a low threshold voltage is set.

However, the conventional methods as proposed above are not sufficiently effective for solving the above-mentioned problems described in conjunction with the point defects caused by high-energy ion implantation for forming a well.

Certainly, the first production process is effective for suppressing the local increase in boron concentration in the vicinity of the separation side wall of the buried channel. However, considering that the simplification of a production process and the decrease in production cost are demanded along with the increased demand for realizing a high density and a stable operation of a semiconductor device, the proposed modification is not preferable.

More specifically, according to the process proposed in the above reference, the heat treatment step for diffusing interstitial silicon is conducted after forming a well by the ion implantation step, and thereafter, the ion implantation step for controlling a threshold voltage is conducted. However, in order to realize such a process flow, it is required that a mask used in the implantation step for forming a well is removed to conduct a heat treatment, and thereafter, the implantation steps for respectively controlling a threshold voltage for each of a p-MOSFET and an n-MOSFET are conducted by using different, newly formed masks. Therefore, each step of mask deposition, lithography, and mask removal is actually required to be conducted four times each in relation to the implantation step for forming a well, the heat treatment step for diffusing interstitial silicon, and the implantation steps for respectively controlling a threshold voltage for each of a p-MOSFET and an n-MOSFET.

Furthermore, the above-mentioned method is effective for suppressing the local increase in boron concentration in the vicinity of the separation side wall of the buried channel. However, in view of holding a retrograde shape of a surface channel impurity distribution for controlling a threshold voltage, this method does not bring about satisfactory results.

More specifically, according to the above-mentioned method, the point defects generated by high-energy ion implantation can certainly be distributed evenly in the semiconductor substrate. However, in effect, the point defects are caused even during the ion implantation step for controlling a threshold voltage, resulting in accelerating diffusion of surface channel impurities. According to the above-mentioned method, the accelerating diffusion of such impurities cannot be suppressed.

Furthermore, when a heat treatment step is conducted on the order of minutes, impurities in a semiconductor substrate, e.g., channel impurities, largely diffuse particularly in the temperature increase step. Therefore, in the channel impurity distribution, the concentration increases on a surface and in a deep portion of the semiconductor substrate, making it difficult to maintain a retrograde shape.

In conjunction with the use of indium as a dopant, the tail portion of an impurity distribution after implantation of indium ions spreads toward a deep portion of the semiconductor substrate. Therefore, the impurity concentration in the deep portion of the semiconductor substrate after implantation of indium ions becomes higher than that when $BF_2$ ions are implanted at a 50% acceleration energy. As a result, the junction capacitance between the source/drain regions and the substrate increases, which becomes a serious obstacle for realizing higher performance of a MOSFET. Furthermore, although indium has a small diffusion coefficient, indium is subject to the accelerating diffusion caused by the point defects in a similar manner to that of boron. In addition, it is not easy to activate indium ions, and indium ions are not easily handled during an implantation step, compared with boron.

DISCLOSURE OF THE INVENTION

A method for producing a semiconductor device of the present invention, includes the steps of: forming an impurity diffusion layer for controlling a threshold voltage by ion implantation; and conducting a high-temperature rapid heat treatment for recovering crystal defects generated by the ion implantation.

More specifically, treatment conditions for the high-temperature rapid heat treatment are set in such a manner that interstitial atoms causing the crystal defects are diffused and impurities in the impurity diffusion layer are not diffused. For example, the high-temperature rapid heat treatment is conducted in a temperature range of about 900° C. to about 1100° C.

The above-mentioned method may further include a step of forming a gate oxide film after the high-temperature heat treatment step. Alternatively, during the high-temperature heat treatment step, a gate oxide film may be simultaneously formed.

The above-mentioned method may further include a step of forming a well or a buried layer by high-energy ion implantation prior to the step of forming the impurity diffusion layer. In this case, in one embodiment, a heat treatment is not conducted between the ion implantation step for forming a well or a buried layer and the step of forming the impurity diffusion layer. Preferably, an ion implantation treatment for forming the impurity diffusion layer is conducted, subsequently after at least one well or buried layer is formed by high-energy ion implantation.

In one embodiment, a semiconductor device to be formed is a surface channel-type field effect transistor, ion species used during the ion implantation step for forming the impurity diffusion layer for controlling a threshold voltage is boron, and during the ion implantation step, an ion implantation treatment of boron is conducted in such a manner that a concentration profile of implanted boron is maintained at a low level in a vicinity of a surface of a substrate, has a peak in a deep portion of the substrate, and is maintained at a low level in a junction region between source/drain regions to be formed and the substrate.

In another embodiment, a semiconductor device to be formed is a buried channel-type field effect transistor, and ion species used during the ion implantation step for forming the impurity diffusion layer for controlling a threshold voltage is boron.

An impurity concentration in a vicinity of a surface of a substrate is about $2 \times 10^{17}$ cm$^{-3}$ or less.

Preferably, a temperature increase rate during the high-temperature heat treatment step is in a range of about 50° C./sec. to about 400° C./sec., more preferably in a range of about 75° C./sec. to about 100° C./sec.

A method for producing a semiconductor device provided according to another aspect of the present invention includes the steps of: selectively forming a first protective film on a surface of a semiconductor substrate; implanting predetermined ion species into the semiconductor substrate at different energy levels, using the first protective film as a mask, thereby forming a well and an impurity diffusion layer for controlling a threshold voltage with a first conductivity; removing the first protective film; selectively forming a second protective film in a region on the surface of the semiconductor substrate which is not covered with the first protective film; implanting predetermined ion species into the semiconductor substrate at different energy levels, using the second protective film as a mask, thereby forming a well and an impurity diffusion layer for controlling a threshold voltage with a second conductivity; removing the second protective film; and conducting a high-temperature rapid heat treatment.

Another method for producing a semiconductor device of the present invention includes the steps of: selectively forming a protective film on a surface of a semiconductor substrate; implanting predetermined ion species into the semiconductor substrate at different energy levels, using the protective film as a mask, thereby forming a well and an impurity diffusion layer for controlling a threshold voltage with a first conductivity; removing the protective film; implanting predetermined ion species into an entire surface of the semiconductor substrate at different energy levels, thereby forming a well and an impurity diffusion layer for controlling a threshold voltage with a second conductivity in a region of the semiconductor substrate which is covered with the protective film; and conducting a high-temperature rapid heat treatment.

A still another method for producing a semiconductor device of the present invention includes the steps of: selectively forming an insulation separating region on a semiconductor substrate; selectively forming an insulation separating region on the semiconductor substrate; implanting predetermined ion species into the semiconductor substrate at different energy levels, using the protective film as a mask, thereby forming a well and an impurity diffusion layer for controlling a threshold voltage with a first conductivity; implanting predetermined ion species into the semiconductor substrate, using the protective film as a mask, thereby forming a well with a second conductivity in a region of the semiconductor substrate which is covered with the protective film, and forming a buried layer with a second conductivity in a region under the well with the first conductivity in such a manner that the well with the second conductivity and the buried layer with the second conductivity are formed adjacent to each other in a high concentration under the insulation separating region so as to surround the well with the first conductivity; removing the protective film; implanting predetermined ion species into an entire surface of the semiconductor substrate, thereby forming an impurity diffusion layer for controlling a threshold voltage in a region of the semiconductor substrate which is covered with the protective film; and conducting a high-temperature rapid heat treatment.

A still another method for producing a semiconductor device of the present invention includes the steps of: selectively forming an insulation separating region on a semiconductor substrate; selectively forming a multi-layer film composed of a first protective film overlapped with a second protective film on a surface of the semiconductor substrate; implanting predetermined ion species into the semiconductor substrate, using the multi-layer film as a mask, thereby forming a well with a first conductivity; removing the second protective film; implanting predetermined ion species into the semiconductor substrate, using the first protective film as a mask, thereby forming a well with a second conductivity in a region of the semiconductor substrate which is covered with the first protective film, and forming a buried layer with a second conductivity in a region under the well with the first conductivity in such a manner that the well with the second conductivity and the buried layer with the second conductivity are formed adjacent to each other in a high concentration under the insulation separating region so as to surround the well with the first conductivity; implanting ions into the semiconductor substrate, using the first protective film as a mask; removing the first protective film; implanting ions into an entire surface of the semiconductor substrate; and conducting a high-temperature rapid heat treatment.

A still another method for producing a semiconductor device of the present invention includes the steps of: selectively forming a first protective film on a surface of a semiconductor substrate; implanting predetermined ion species into the semiconductor substrate, using the first protective film as a mask, thereby forming a deep buried layer with a first conductivity; removing the first protective film; selectively forming a second protective film on a surface of the semiconductor substrate; implanting predetermined ion species into the semiconductor substrate at different energy levels, using the second protective film as a mask, thereby forming a well with a second conductivity and an impurity diffusion layer for controlling a threshold voltage; removing the second protective film; selectively forming a third protective film in a region on the surface of the semiconductor substrate which is not covered with the second protective film; implanting predetermined ion species into the semiconductor substrate, using the third protective film as a mask, thereby forming a well with a first conductivity in a region of the semiconductor substrate which is not covered with the third protective film in such a manner that the well with the first conductivity and the buried layer with the first conductivity are formed adjacent to each other so as to surround the well with the second conductivity; implanting predetermined ion species into the semiconductor substrate, using the third protective film as a mask, thereby forming an impurity diffusion layer for controlling a threshold voltage; removing the third protective film; selectively forming a fourth protective film on the surface of the semiconductor substrate; implanting ions into the semiconductor substrate, using the fourth protective film as a mask, thereby forming an impurity diffusion layer for controlling a threshold voltage in the well with the second conductivity; and conducting a high-temperature rapid heat treatment.

A still another method for producing a semiconductor device of the present invention includes the steps of: selectively forming a first protective film on a surface of a semiconductor substrate; implanting predetermined ion species into the semiconductor substrate at different energy levels, using the first protective film as a mask, thereby forming a deep buried layer and an impurity diffusion layer for controlling a threshold voltage with a first conductivity; removing the first protective film; selectively forming a second protective film on a surface of the semiconductor substrate; implanting predetermined ion species into the semiconductor substrate at different energy levels, using the second protective film as a mask, thereby forming, adjacent to the deep buried layer with the first conductivity, a well and an impurity diffusion layer for controlling a threshold voltage with a first conductivity in a region of the semiconductor substrate which is not covered with the second protective film; implanting ion species with a second conductivity into the semiconductor substrate through the second protective film, thereby forming a predetermined well in a region of the semiconductor substrate which is not covered with the second protective film; removing the second protective film; selectively forming a third protective film on the surface of the semiconductor substrate; implanting predetermined ion species into the semiconductor substrate, using the third protective film as a mask, thereby forming an impurity diffusion layer for controlling a threshold voltage; removing the third protective film; and conducting a high-temperature rapid heat treatment.

In the above-mentioned various methods for producing a semiconductor device of the present invention, specifically, treatment conditions for the high-temperature rapid heat treatment are set in such a manner that interstitial atoms causing the crystal defects are diffused and impurities in the impurity diffusion layer are not diffused. For example, the high-temperature rapid heat treatment is conducted in a temperature range of about 900° C. to about 1100° C.

An impurity concentration in a vicinity of a surface of a substrate may be about $2\times10^{17}$ cm$^{-3}$ or less.

Preferably, a temperature increase rate during the high-temperature heat treatment step is in a range of about 50° C./sec. to about 400° C./sec., more preferably about 75° C./sec. to about 100° C./sec.

A method for producing a semiconductor device provided according to still another aspect of the present invention includes the steps of: forming an impurity diffusion layer for controlling a threshold voltage by ion implantation; conducting a high-temperature rapid heat treatment for correcting crystal defects generated by the ion implantation; forming a gate oxide film; and forming source/drain regions.

As described above, the objective of the present invention is to provide a method for producing a semiconductor device which prevents interstitial silicon generated when a well is formed from adversely affecting the threshold voltage control due to the subsequent heat treatment step, while suppressing the re-distribution of impurities in a well, and in which an implantation step for forming a well and an implantation step for controlling a threshold voltage are conducted using an identical mask with respect to an n-MOSFET and a p-MOSFET, thereby realizing a simplified process.

Furthermore, according to the present invention, in a buried channel-type MOSFET, a shallow impurity diffusion region for controlling a threshold voltage can be formed, so that a high driving force can be realized while suppressing the deviations of an off-leak current and a threshold voltage.

In a surface channel-type MOSFET, since the impurities for controlling a threshold voltage hold a retrograde distribution shape, the occurrence of a short channel effect is suppressed while suppressing the increase in junction capacitance, resulting in realization of a high driving force.

BRIEF DESCRIPTION OF THE DRAWINGS

FIG. 4A shows SIMS profiles in a range from a surface to a depth of 1.5 μm; and FIG. 4B shows enlarged profiles in a range from a surface to a depth of 0.3 μm in FIG. 4A.

FIGS. 7A through 7I are cross-sectional views showing each process step in a method for producing a semiconductor device in accordance with the first embodiment of the present invention.

FIGS. 9A through 9I are cross-sectional views showing each process step in a method for producing a semiconductor device in accordance with the third embodiment of the present invention.

FIGS. 11A through 11K are cross-sectional views showing each process step in a method for producing a semiconductor device in accordance with the fifth embodiment of the present invention.

FIGS. 13A through 13K are cross-sectional views showing each process step method for producing a semiconductor device in accordance with the seventh embodiment of the present invention.

BEST MODE FOR CARRYING OUT THE INVENTION

Figure 1A:
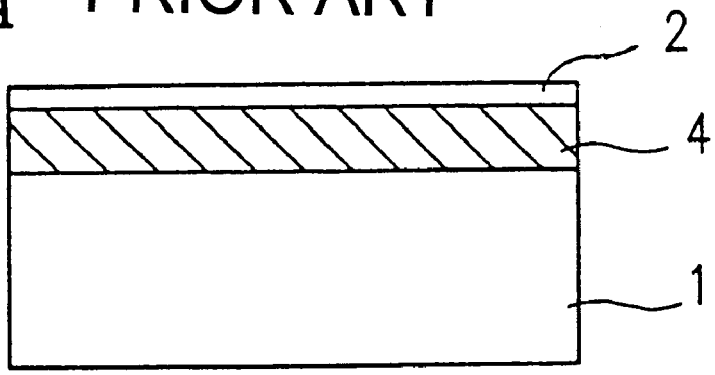
FIGS. 1A through 1C are cross-sectional views illustrating a conventional production process.

First, the details on the course of obtaining the present invention will be described.

For forming a CMOS, a p-type well and an n-type well are formed by high-energy implantation. As described above, according to the conventional technique, defects caused by implantation were recovered by heat treatment after high-energy ion implantation. However, according to such a conventional technique, after the defect recovery, ions are further implanted for the purpose of controlling a threshold voltage of a p-type well and an n-type well. Therefore, four masks were required in total: a mask for forming a p-type well, a mask for forming an n-type well, a mask for ion implantation for controlling a threshold of a p-type well, and a mask for ion implantation for controlling a threshold of an n-type well.

The inventors of the present invention have considered the possibility of using the same mask for forming wells and for ion implantation for controlling a threshold so as to decrease the number of steps to achieve a cost reduction. According to this method, the ion implantation for controlling a threshold can be conducted simultaneously with forming wells, so that the number of masks can be halved and the number of steps can be reduced. More specifically, the formation of a p-type well, as well as the ion implantation for controlling a threshold of an n-MOSFET to be formed in the p-type well, are conducted by using a mask for forming the p-type well. Similarly, the formation of an n-type well, as well as the implantation for controlling a threshold of an n-MOSFET to be formed in the n-type well, are conducted by using a mask for forming the n-type well. Thereafter, gate oxide films to be the n-MOSFET and the p-MOSFET are formed.

A heat treatment for forming a gate oxide film is conducted at about 850° C., which is relatively a low temperature for a semiconductor process. However, according to the study by the inventors of the present invention, it was found that an impurity diffusion layer for controlling a threshold diffuses extraordinarily at more than a diffusion coefficient peculiar to atoms. The inventors of the present invention considered that the above-mentioned phenomenon might be ascribed to point defects caused by high-energy ion implantation. Specifically, they considered that the point defects would cause diffusion comparable to that caused by a heat treatment at a high temperature of about 1000° C., even during a heat treatment at a low temperature (about 850° C.).

In order to suppress the extraordinary diffusion, according to the present invention, a high-temperature rapid heat treatment (RTA) is conducted after ion implantation for controlling a threshold, thereby preventing extraordinary diffusion during the step of forming a gate oxide film. More specifically, instead of conducting the step of forming a gate oxide film as the first heat treatment step, another heat treatment step is conducted prior to that, whereby point defects previously generated and accumulated are recovered. According to the present invention, extraordinary diffusion is prevented by such a procedure, enabling the miniaturization of a MOSFET to be realized.

Before describing specific embodiments of the present invention, first, the relationship between the threshold voltage (Vt) and the high-temperature rapid heat treatment (hereinafter, referred to as "RTA") which is one of the main features of the present invention will be described with reference to FIGS. 1A through 6, and FIGS. 15 through 17.

In the course of semiconductor production, during ion implantation, crystal defects, i.e., vacancy or interstitial silicon, are generated in a semiconductor substrate. Impurities in the semiconductor substrate diffuse at a high temperature of 650° C. or higher, at which time the above-mentioned vacancy and interstitial atoms (e.g., interstitial silicon) accelerate the diffusion of the impurities. According to the present invention, a production process is proposed, in which vacancy and interstitial silicon generated during ion implantation is diffused or eliminated while undesired diffusion of the impurities is suppressed, whereby the concentration of the impurities for controlling a threshold voltage is capable of maintaining a retrograde distribution shape holding the difference between the concentration on a surface and the peak value in a deep portion of the substrate (the peak value in the deep portion of the substrate is larger).

For comparison, first, a general conventional production process will be described with reference to FIGS. 1A through 1C.

Figure 1B:
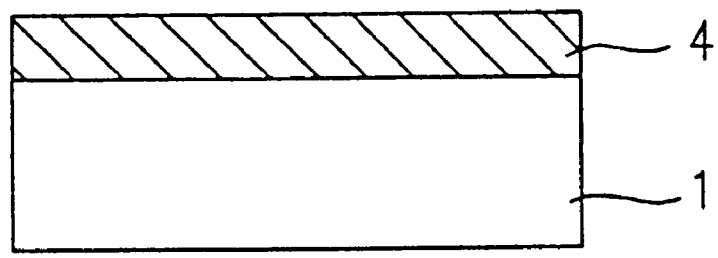
Figure 1C:
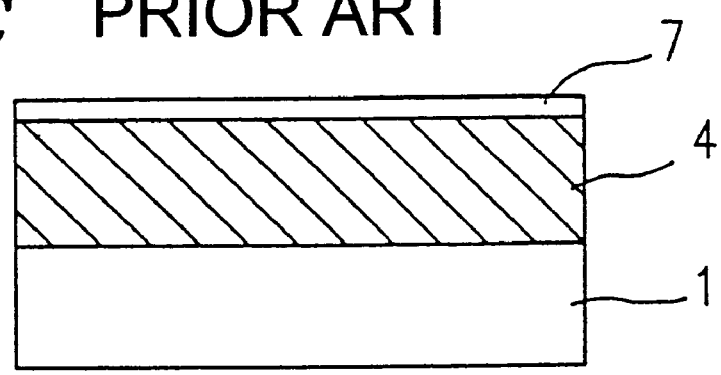
Figure 2:
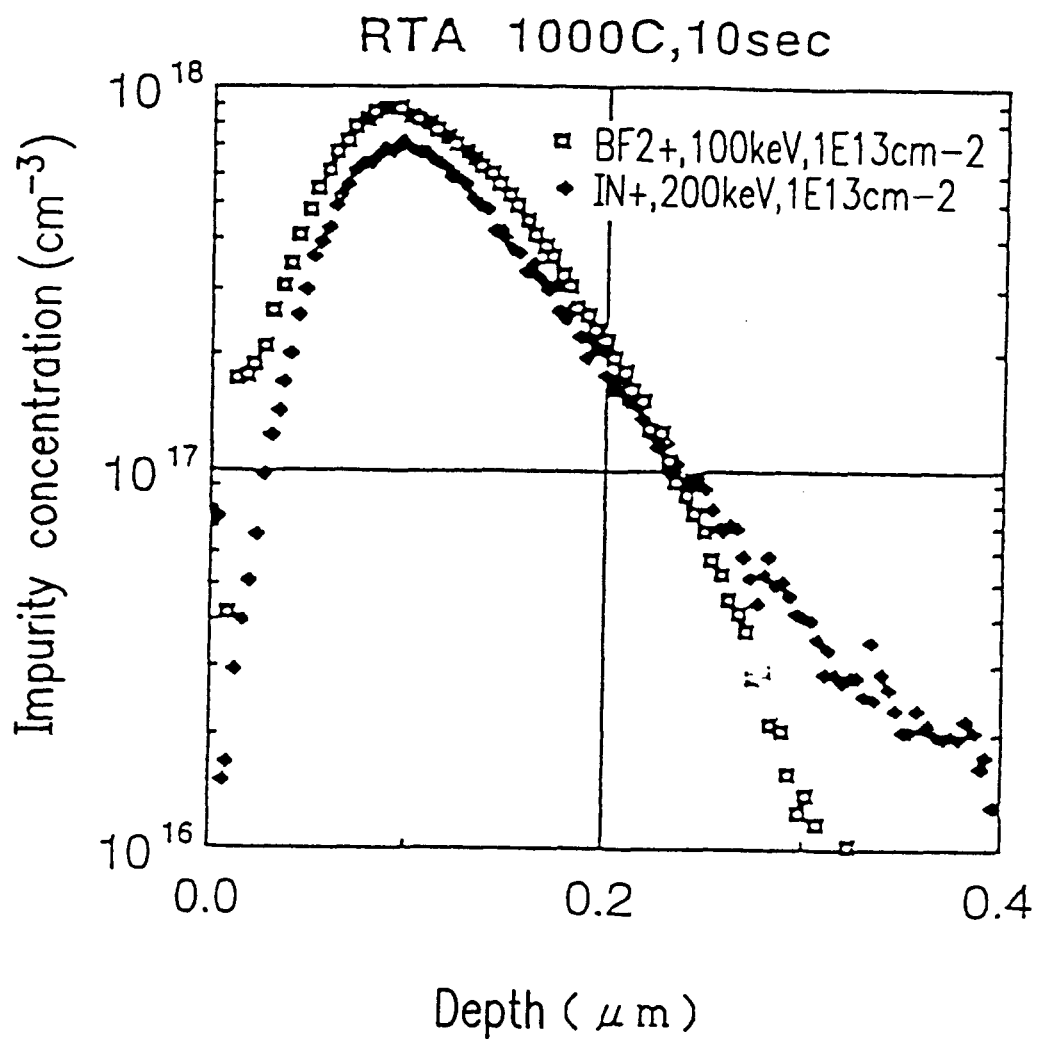
FIG. 2 shows data actually measured by SIMS, showing concentration profiles of implanted boron ions and indium ions.

First, as shown in FIG. 1A, $BF_2$ ions are implanted into a p-type low concentration substrate 1 at an acceleration voltage of 100 keV and a dose amount of $4.0 \times 10^{12}$ cm$^{-2}$ through a protective oxide film 2 for ion implantation, whereby an impurity diffusion layer 4 for controlling a threshold voltage is formed. Then, the protective oxide film is removed as shown in FIG. 1B, and a gate oxide film 7 is further formed during a heat oxidation step at a temperature of 850° C. for 30 minutes as shown in FIG. 1C.

On the other hand, as described above, in order to maintain a retrograde channel impurity distribution, indium having a very low diffusion coefficient may be used as impurities for controlling a threshold voltage. Indium is very unlikely to be subject to the accelerating diffusion caused by vacancy and interstitial silicon generated during ion implantation. However, as represented by data actually measured by SIMS analysis shown in FIG. 2, a tail portion of a distribution of implanted ions spreads more when indium ions (In$^+$) are implanted, than when boron ions (BF$_2^+$) are implanted. Therefore, the junction capacitance between the source/drain regions and the substrate increases. Furthermore, indium is an atom which is difficult to be handled with, and will have undesired effects such as pose time deterioration when used for a memory LSI such as a DRAM.

According to the present invention, a production process as described below with reference to FIGS. 3A through 3D is conducted.

Figure 3A:
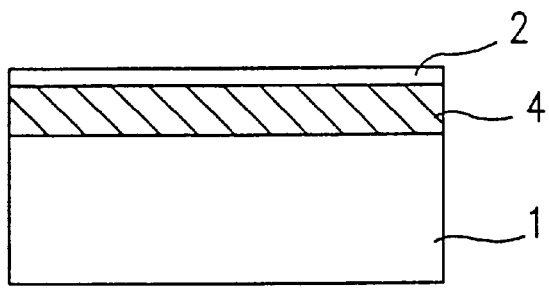
FIGS. 3A through 3D are cross-sectional views illustrating a production process according to the present invention.
Figure 3B:
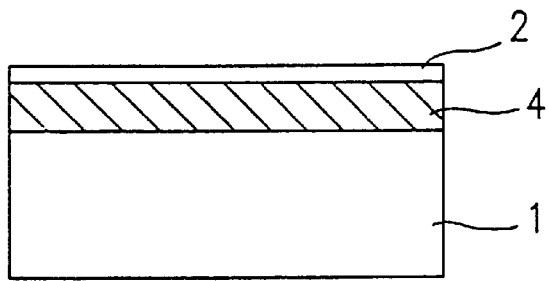
Figure 3C:
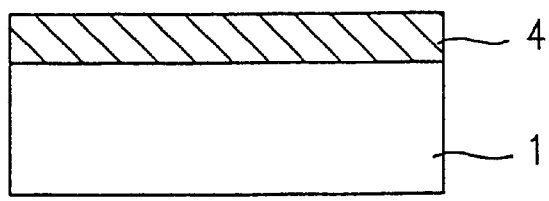
Figure 3D:
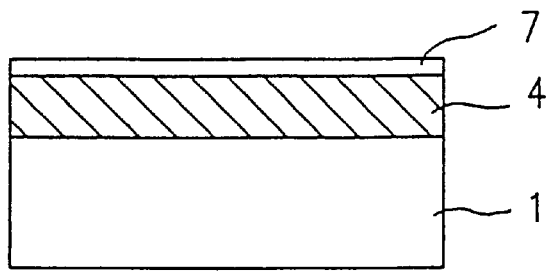

More specifically, first as shown in FIG. 3A, $BF_2$ ions are implanted into a p-type low concentration substrate 1 at an acceleration voltage of 100 keV and a dose amount of $4.0 \times 10^{12}$ cm$^{-2}$ through a protective oxide film 2 for ion implantation, whereby an impurity diffusion layer 4 for controlling a threshold voltage is formed. Then, during the step shown in FIG. 3B, an RTA treatment is conducted at a temperature of 1000° C. for 10 seconds to diffuse interstitial silicon generated during the above-mentioned ion implantation. Thereafter, as shown in FIG. 3C, the protective oxide film is removed, and a gate oxide film 7 is further formed by a heat treatment step at a temperature of 850° C. for 30 minutes as shown in FIG. 3D.

Herein, the above-mentioned RTA treatment is conducted at a higher temperature but for a shorter period of time than that for a heat treatment which is generally performed for activation of impurities. This allows interstitial atoms (e.g., interstitial silicon) to diffuse without diffusing implanted impurities. More specifically, for example, the RTA heat treatment according to the present invention is conducted in a temperature range of about 900° C. to about 1100° C. over about 10 seconds. When the temperature at which the RTA treatment is conducted is lower than about 900° C., there is a possibility that point defects (vacancy and interstitial silicon) may remain. When the temperature at which the RTA treatment is conducted is higher than about 1100° C., implanted impurities may diffuse due to the annealing effect, which is not preferable.

Furthermore, it is desirable that a temperature increase rate is set in a range of about 50° C./sec. to about 400° C./sec. When the temperature increase rate is about 400° C./sec. or higher, the substrate itself is immediately damaged due to heat strain. When the temperature increase rate is about 50° C./sec. or lower, the impurities may diffuse, which is not preferable. In order to eliminate point defects without causing the diffusion of the impurities, the above-mentioned range is preferable.

More preferably, the temperature increase rate is set in a range of about 75° C./sec. to about 100° C./sec.

Figure 4A:
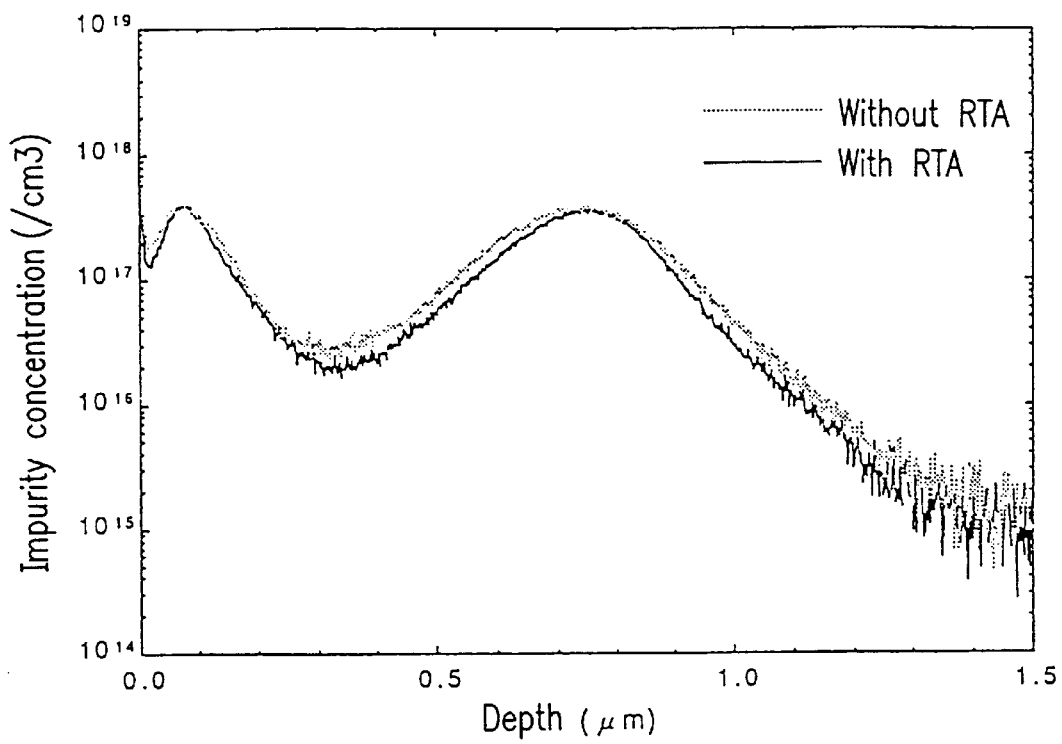
FIGS. 4A and 4B show data actually measured by SIMS of impurity distributions obtained in the conventional production process (without RTA) and the production process (with RTA) according to the present invention, respectively.
Figure 4B:
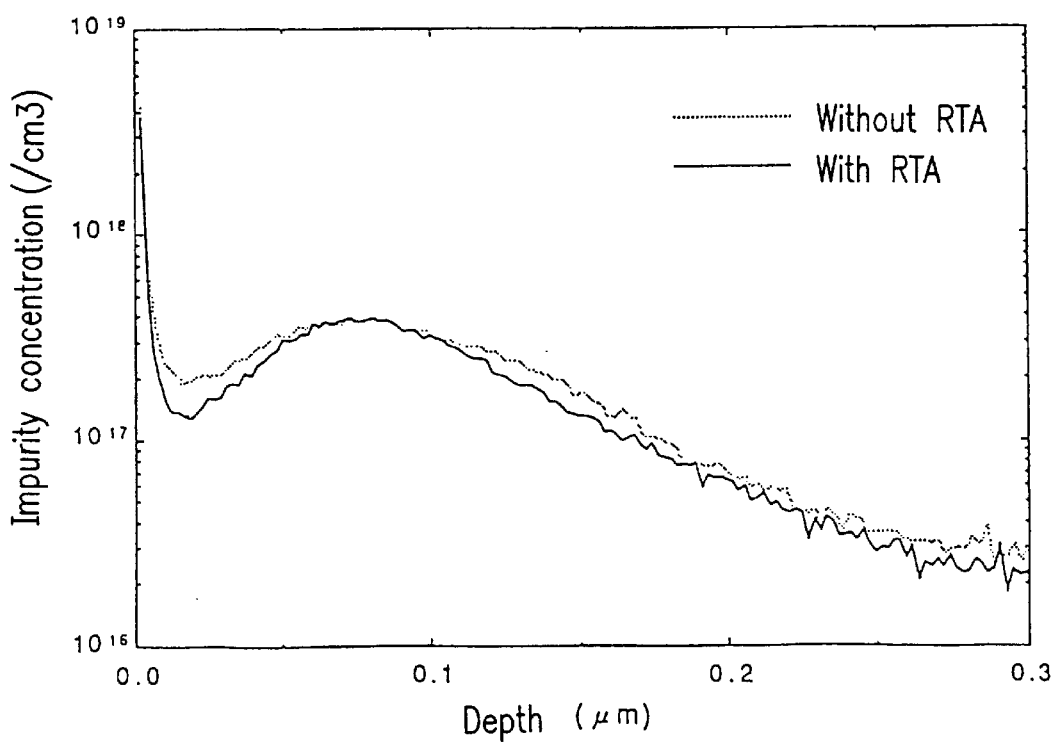

FIGS. 4A and 4B show data actually measured by SIMS of impurity distributions obtained in the conventional production process (represented by "without RTA") in which the RTA treatment is not conducted as described with reference to FIGS. 1A through 1C and the production process (represented by "with RTA") according to the present invention involving the RTA treatment as described with reference to FIGS. 3A through 3D. FIG. 4A shows SIMS profiles in a range from a surface to a depth of 1.5 μm; and FIG. 4B shows enlarged profiles in a range from a surface to a depth of 0.3 μm in FIG. 4A. For measuring the SIMS profiles in FIGS. 4A and 4B, boron is implanted at an acceleration voltage of 300 keV and a dose amount of $1.0 \times 10^{13}$ cm$^{-2}$ simultaneously with the implantation of impurity ions for controlling a threshold voltage, whereby a retrograde p-well is formed.

By conducting the RTA treatment after the ion implantation for controlling a threshold voltage in accordance with the present invention, the impurity concentration in the vicinity of the surface, which was $2.0 \times 10^{17}$ cm$^{-3}$ in the conventional technique, is suppressed to about $1 \times 10^{17}$ cm$^{-3}$, and thus, a retrograde channel distribution in which a deep diffusion toward the inside of the substrate is suppressed is formed. The reason for this is as follows: according to the present invention, in addition to vacancy and interstitial silicon generated during high-energy implantation for forming a well, vacancy and interstitial silicon generated during impurity ion implantation for controlling a threshold voltage are diffused or eliminated for a short period of time, by conducting the RTA treatment after the impurity ion implantation for controlling a threshold voltage, whereby the accelerating diffusion of the channel impurity distribution caused by the latter is suppressed. By further optimizing this procedure, a surface impurity concentration of $1.0 \times 10^{17}$ cm$^{-3}$ or less can be achieved.

According to the conventional production process, vacancy and interstitial silicon generated during well implantation are eliminated by a well drive-in step or the like. However, this is not sufficient for suppressing the accelerating diffusion caused by vacancy and interstitial silicon generated during impurity ion implantation for controlling a threshold voltage. In contrast, in the RTA treatment on the order of seconds to be conducted after the impurity ion implantation for controlling a threshold voltage according to the present invention, the diffusion of the impurities (e.g., boron) for controlling a threshold voltage is suppressed, whereby vacancy and interstitial silicon generated during the respective implantation steps for forming a well and for controlling a threshold voltage can be simultaneously diffused or eliminated. This enables the respective intended impurities for forming a well and for controlling a threshold voltage can be continuously implanted by using the same mask, making it possible to decrease the number of masks and reduce a production cost.

The above-mentioned "continuous implantation" refers to the implantation of impurity ions using the same mask, and the two implantation steps are not necessarily continuous in terms of time. For example, steps of forming a channel stop layer and forming a punch-through stop layer may be conducted between the two implantation steps. Alternatively, even when the order of the two implantation steps are reversed, the same effects can be obtained.

Furthermore, a gate oxide film can also be simultaneously formed at a time of conducting the RTA treatment after the impurity implantation step for controlling a threshold voltage, by an oxidation step, for example, at a temperature of 1000° C. within 1 minute or less. This means that the two steps including the RTA and the step of forming a gate oxide film are replaced by one step called a high-temperature rapid heat oxidation (RTO) treatment, which allows a production process to be further simplified. This RTO treatment can be effectively applied to the step of forming a gate oxide film before a nitriding treatment at a time of forming a nitride oxide film.

Next, the effects of the above-mentioned production process according to the present invention on the operational characteristics of a semiconductor device formed thereby will be described with reference to the results of process/device simulation shown in FIGS. 5 and 6.

Figure 5:
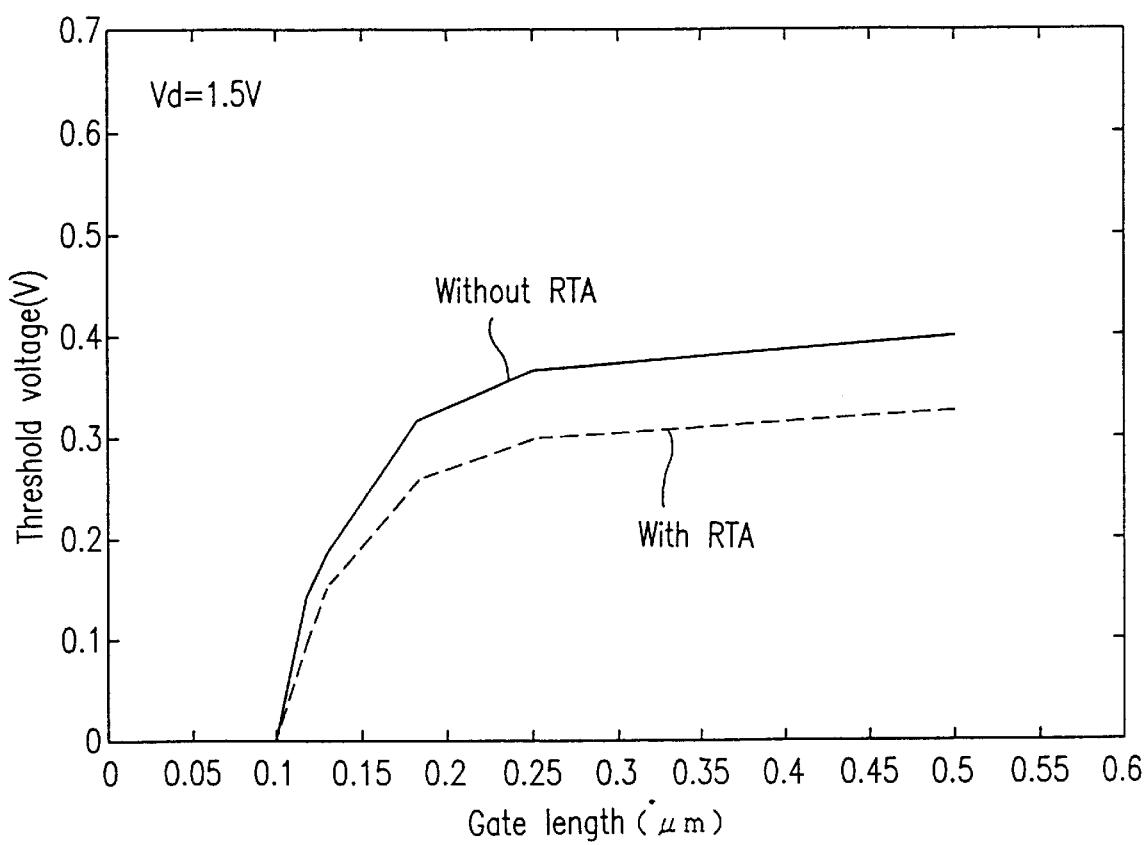
FIG. 5 is a graph showing the relationship between the gate length and the threshold voltage in each of the conventional production process (without RTA) and the production process (with RTA) according to the present invention.

FIG. 5 is a graph showing the relationship between the gate length and the threshold voltage in each of the conventional production process (represented by "without RTA") not involving the RTA treatment described with reference to FIGS. 1A through 1C and the production process (represented by "with RTA") according to the present invention involving the RTA treatment described with reference to FIGS. 3A through 3D. The graph shows influences of a short channel effect.

As is understood from FIG. 5, there exists only a slight difference between both processes in the case of a short gate length; however, particularly in the case where the gate length is long, a semiconductor device produced by the production process of the present invention involving the RTA treatment before forming a gate oxide film shows a lower threshold voltage than that of the conventional semiconductor device formed without involving the RTA treatment. Thus, the retrograde channel impurity distribution formed by the production process of the present invention has significant advantages on the suppression of a short channel effect involved in the reduction of a threshold voltage. The reason for this is that the diffusion of the impurities implanted for controlling a threshold voltage is suppressed to increase the peak concentration of the impurities, whereby the extension of a depletion layer from source/drain regions is suppressed.

Figure 6:
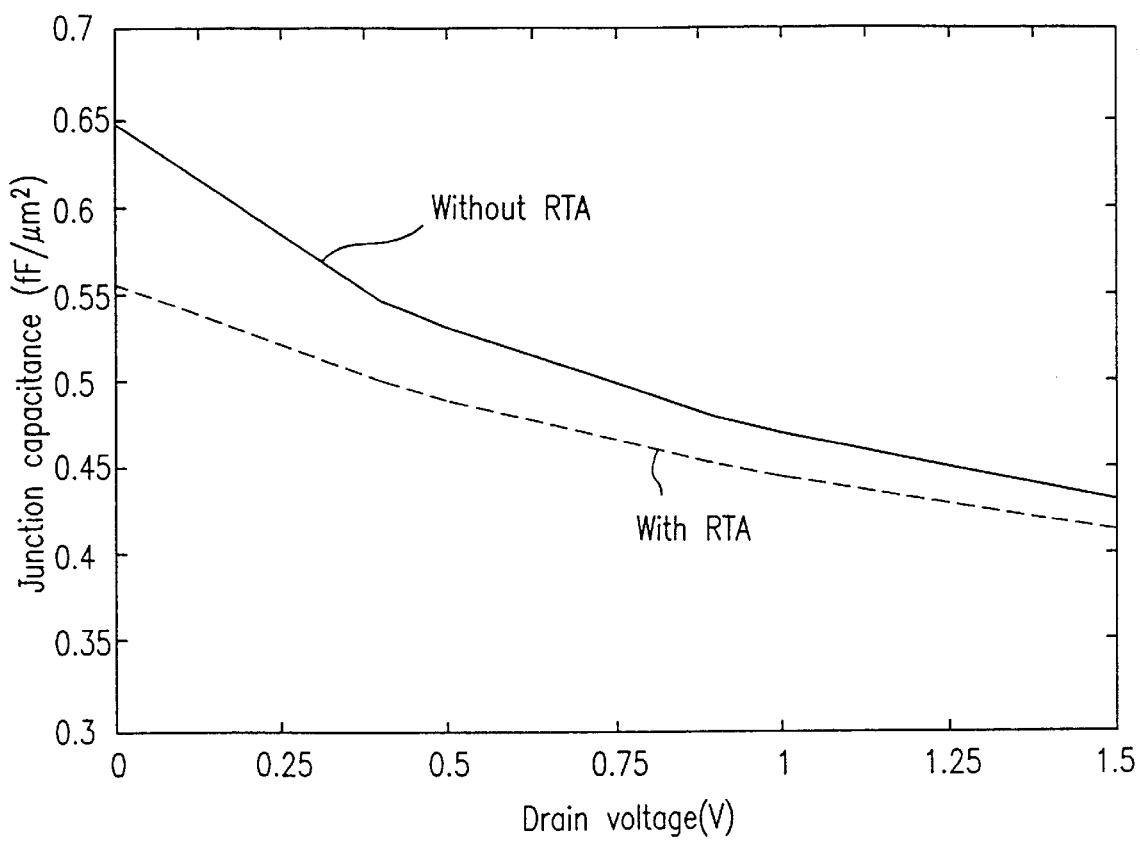
FIG. 6 is a graph showing the relationship between the junction capacitance and the drain voltage in an n-MOSFET in each of the conventional production process (without RTA) and the production process (with RTA) according to the present invention.

FIG. 6 shows the relationship between the drain-substrate junction capacitance and the drain voltage in an n-MOSFET for each of the conventional production process (represented by "without RTA") and the production process (represented by "with RTA") according to the present invention.

It is understood from the figure that the n-MOSFET produced according to the present invention has a junction capacitance which is about 10% smaller. This is because the diffusion of the impurities implanted for controlling a threshold voltage is suppressed in the semiconductor device formed according to the present invention, and the concentration is low in the tail portion in the impurity distribution positioned in the junction portion between the source/drain regions and the substrate.

Furthermore, when the impurity concentration on the surface of the substrate is high, a saturated current value decreases due to the effect of surface scattering. However, the RTA treatment according to the present invention suppresses the diffusion of the impurities implanted for controlling a threshold voltage to decrease the impurity concentration on the surface of the substrate, so that the saturated current value can be increased.

As described above, according to the semiconductor production process of the present invention, the diffusion of the impurities implanted for controlling a threshold voltage is suppressed by the RTA treatment, thereby preventing a short channel effect from having adverse effects, particularly in the case where a threshold voltage is set low, reducing the junction capacitance between the source/drain regions and the substrate, and increasing a saturated current value. As a result, the stabilization and high-speed of the operation of a semiconductor device to be formed can be realized.

Furthermore, the effects of the present invention will be further described with reference to specific actually measured data.

Figure 15:
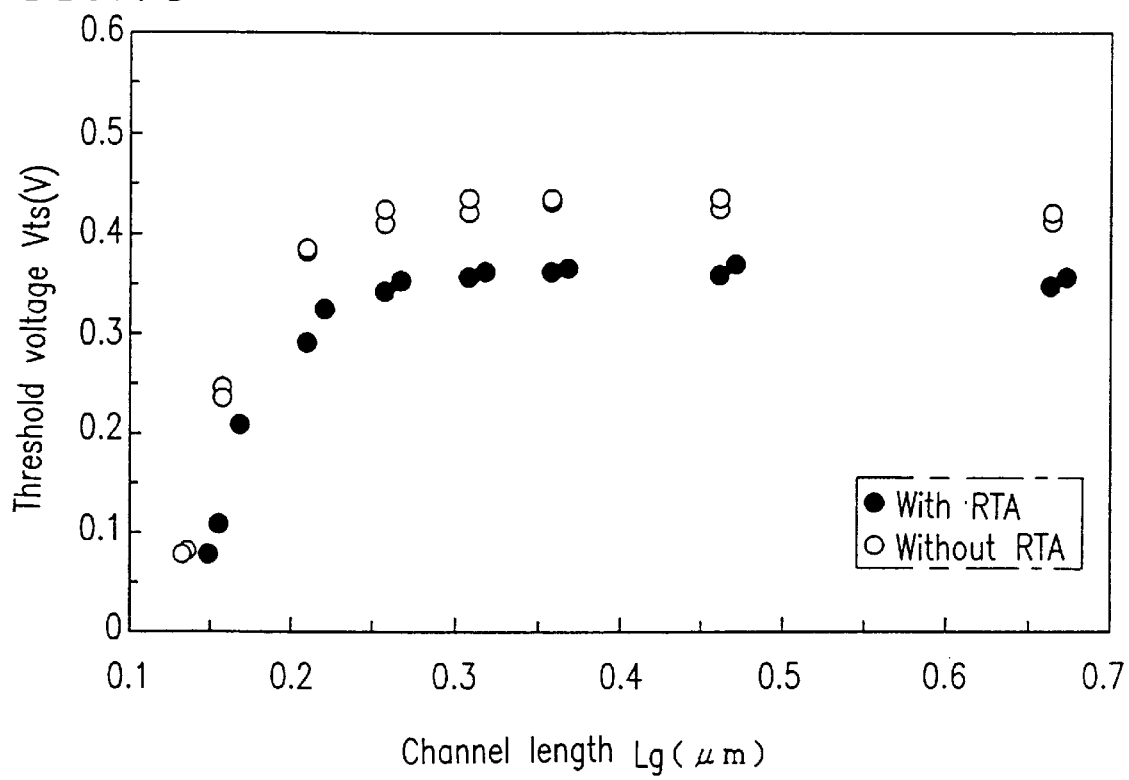
FIG. 15 shows actually measured data showing the relationship between the channel length Lg and the threshold voltage Vts in semiconductor devices respectively formed in accordance with the production process (with RTA) according to the present invention and the conventional production process (without RTA).
Figure 16:
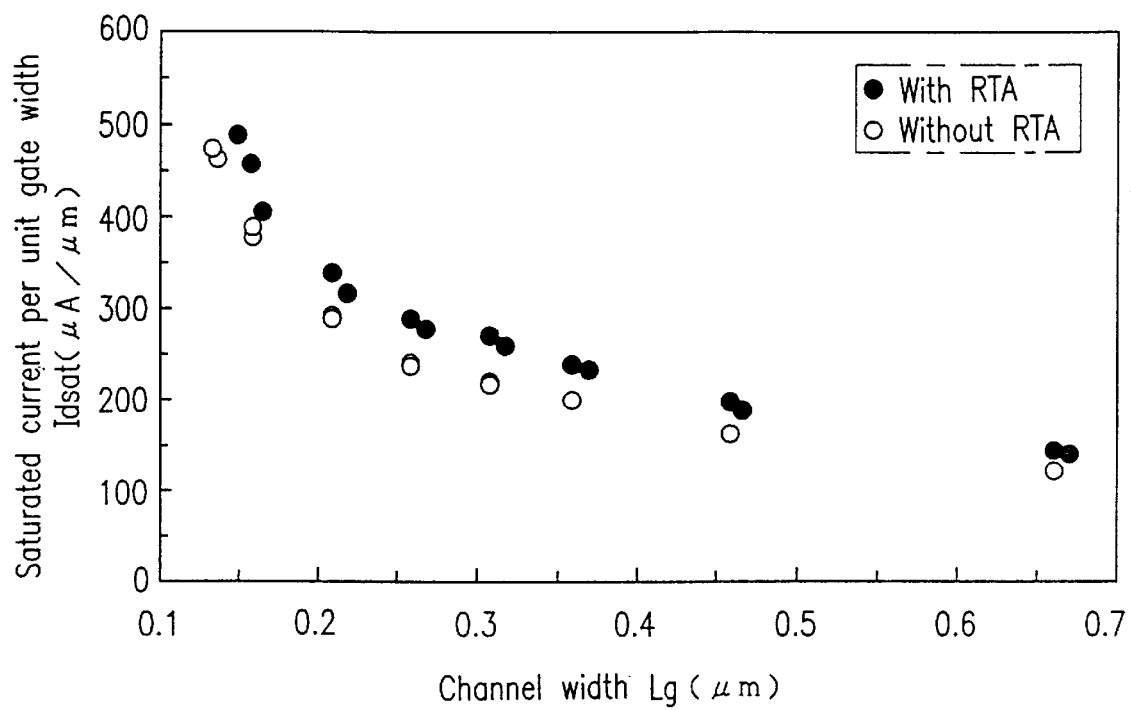
FIG. 16 shows actually measured data showing the relationship between the channel length Lg and the saturated current Idsat per unit gate width in semiconductor devices respectively formed in accordance with the production process (with RTA) according to the present invention and the conventional production process (without RTA).
Figure 17:
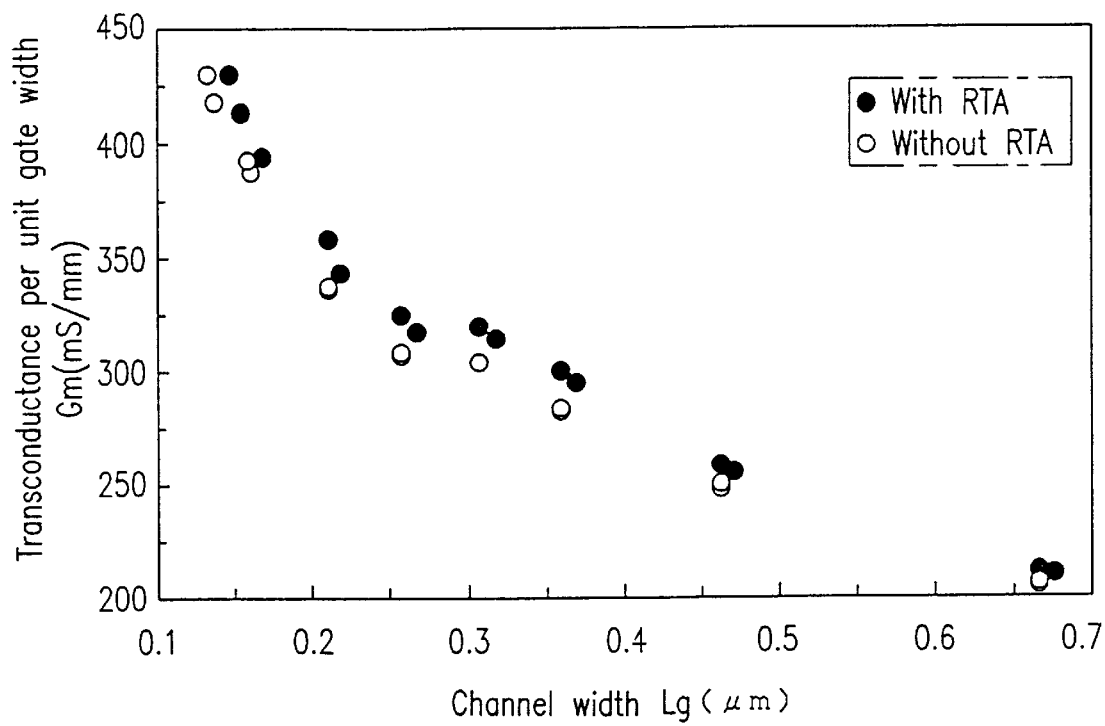
FIG. 17 shows actually measured data showing the relationship between the channel length Lg and the transconductance Gm per unit gate width in semiconductor devices respectively formed in accordance with the production process (with RTA) according to the present invention and the conventional production process (without RTA).

FIG. 15 shows actually measured data showing the relationship between the channel length Lg and the threshold voltage Vts in semiconductor devices respectively formed in accordance with the production process according to the present invention (with RTA) and the conventional production process (without RTA). FIG. 16 shows actually measured data showing the relationship between the channel length Lg and the saturated current Idsat per unit gate width in semiconductor devices respectively formed in accordance with the production process according to the present invention (with RTA) and the conventional production process (without RTA). Furthermore, FIG. 17 shows actually measured data showing the relationship between the channel length Lg and the transconductance Gm per unit gate width in semiconductor devices respectively formed in accordance with the production process according to the present invention (with RTA) and the conventional production process (without RTA).

As is apparent from the graph shown in FIG. 15, it is understood that according to the present invention, the decrease in threshold voltage is small when a gate length is shortened, and the durability against the short channel effect is improved, compared with the conventional technique. Furthermore, it is understood from FIG. 16 that the saturated current value is improved by about 10% to about 15% compared with the conventional technique, and thus, a semiconductor device with a large driving force and a high operation speed is obtained. Furthermore, it is understood from FIG. 17, a transconductance is improved by about 10%, and a driving force is improved according to the present invention, compared with the conventional technique.

Hereinafter, some embodiments of the method for producing a semiconductor device of the present invention having the above-mentioned features will be described with reference to the attached drawings.

Embodiment 1

FIGS. 7A through 7I are cross-sectional views showing each process step in a method for producing a semiconductor device in accordance with the first embodiment of the present invention.

First, as shown in FIG. 7A, a p-type low concentration substrate 1 is thermally oxidized to form a protective oxide film 2 for ion implantation. In the figure, the reference numeral 50 denotes an insulation separating region for device separation.

Next, as shown in FIG. 7B, a mask 51 is selectively formed on the protective oxide film 2, and boron is implanted at an acceleration voltage of 400 keV and a dose amount of $4.4 \times 10^{12}$ cm$^{-2}$, utilizing the mask 51, whereby a retrograde p-type well 3 is formed. Furthermore, boron for forming a channel stop layer is implanted at an acceleration voltage of 160 keV and a dose amount of $6.0 \times 10^{12}$ cm$^{-2}$, using the same mask 51, and boron for forming an impurity diffusion layer 4 for controlling a threshold voltage is implanted at an acceleration voltage of 30 keV and a dose amount of $4.7 \times 10^{12}$ cm$^{-2}$.

The channel stop layer is formed between wells having different conductivity and under the insulation separating region for device separation. For simplicity, the channel stop layer is not shown in the figure. This is also similar in each of the embodiments described later.

Next, the mask 51 is removed, and a new mask 52 is selectively formed on the protective oxide film 2, as shown in FIG. 7C. The mask 52 is patterned so as to cover a portion which has not been covered with the mask 51. Then, phosphorus is implanted at an acceleration voltage of 700 keV and a dose amount of $1.0 \times 10^{13}$ cm$^{-2}$, utilizing the mask 52, whereby a retrograde n-type well 5 is formed. Furthermore, phosphorus for forming a punch-through stop layer is implanted at an acceleration voltage of 160 keV and a dose amount of $6.0 \times 10^{12}$ cm$^{-2}$, using the same mask 52, and BF$_2$ for forming an impurity diffusion layer 6 for controlling a threshold voltage is implanted at an acceleration voltage of 70 keV and a dose amount of $6.6 \times 10^{12}$ cm$^{-2}$. Thus, a buried channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ cm$^{-2}$.

Next, the mask 52 is removed as shown in FIG. 7D, and a heat treatment (RTA treatment) is conducted at a temperature of 1000° C. for 10 seconds, whereby point defects such as interstitial silicon and vacancy generated at a time of the above-mentioned ion implantation are diffused. Furthermore, after the protective oxide film 2 is removed as shown in FIG. 7E, a gate oxide film 7 is formed by a heat treatment at a temperature of 850° C. for 30 minutes, as shown in FIG. 7F. Even when such a heat treatment for forming the gate oxide film 7 is conducted, the point defects have been eliminated by the above-mentioned RTA treatment. Therefore, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Furthermore, as shown in FIG. 7G, gate electrodes 8 are selectively formed on the gate oxide film 7. Next, as shown in FIG. 7H, a mask 53 covering the n-type well 5 is formed, and arsenic is implanted at an acceleration voltage of 50 keV and a dose amount of $2.0 \times 10^{15}$ cm$^{-2}$, utilizing the gate electrodes 8 and the mask 53, whereby source/drain regions 9 of an n-MOSFET are formed. Furthermore, after the mask 53 is removed, as shown in FIG. 7I, a mask 54 covering the p-type well 3 is formed, and BF$_2$ is implanted at an acceleration voltage of 30 keV and a dose amount of $2.0 \times 10^{15}$ cm$^{-2}$, utilizing the gate electrodes 8 and the mask 54, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of BF$_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

Embodiment 2

FIGS. 8A through 8I are cross-sectional views showing each process step in a method for producing a semiconductor device in accordance with the second embodiment of the present invention.

Figure 8A:
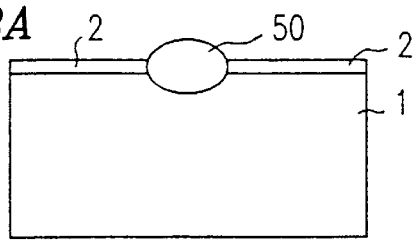
FIGS. 8A through 8I are cross-sectional views showing each process step in a method for producing a semiconductor device in accordance with the second embodiment of the present invention.

First, as shown in FIG. 8A, a p-type low concentration substrate 1 is thermally oxidized to form a protective oxide film 2 for ion implantation. In the figure, the reference numeral 50 denotes an insulation separating region for device separation.

Figure 8F:
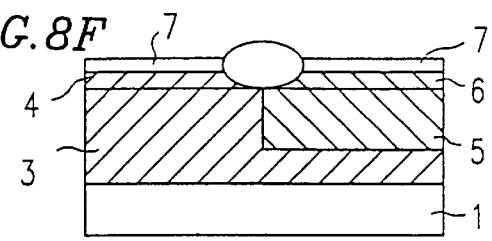
Figure 8B:
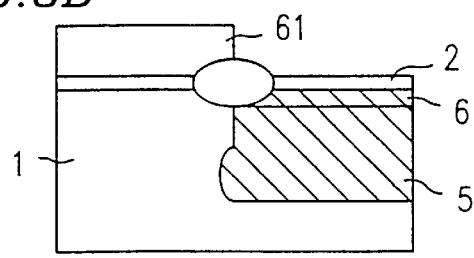

Next, as shown in FIG. 8B, a mask 61 is selectively formed on the protective oxide film 2, and phosphorus is implanted at an acceleration voltage of 400 keV and a dose amount of $1.0 \times 10^{13}$ cm$^{-2}$, utilizing the mask 61, whereby a retrograde n-type well 5 is formed. Furthermore, phosphorus for forming a punch-through stop layer is implanted at an acceleration voltage of 160 keV and a dose amount of $6.0 \times 10^{12}$ cm$^{-2}$, using the same mask 61, and BF$_2$ for forming an impurity diffusion layer 6 for controlling a threshold voltage is implanted at an acceleration voltage of 70 keV and a dose amount of $6.6 \times 10^{12}$ cm$^{-2}$. Thus, a buried channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ cm$^{-2}$.

Figure 8G:
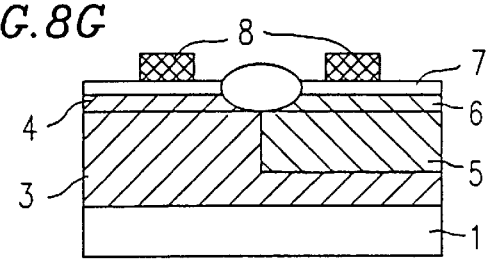
Figure 8C:
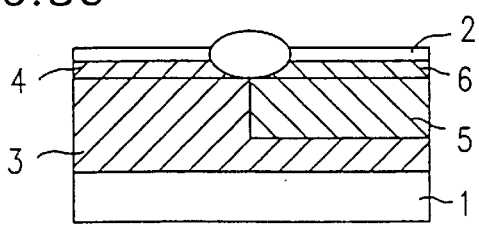

Next, the mask 61 is removed, and as shown in FIG. 8C, boron is implanted into the entire surface including the n-type well 5 at an acceleration voltage of 600 keV and a dose amount of $4.4 \times 10^{12}$ cm$^{-2}$, whereby a retrograde p-type well 3 is formed. Because of such high-energy implantation, the p-type well 3 having a peak of an impurity concentration in a deep portion of the substrate is formed. The p-type well 3 is formed so as to surround the n-type well 5, resulting in a structure having outstanding durability against latchup. Furthermore, in this case, it is not required to form a mask covering the n-type well 5, and the number of masks can be reduced, compared with the case of the first embodiment.

Furthermore, boron for forming a channel stop layer is implanted at an acceleration voltage of 160 keV and a dose amount of $6.0 \times 10^{12}$ cm$^{-2}$, and boron for forming an impurity diffusion layer 4 for controlling a threshold voltage is implanted at an acceleration voltage of 30 keV and a dose amount of $4.7 \times 10^{12}$ cm$^{-2}$.

During these implantation steps, boron is implanted into the entire surface of the substrate. In the case where a buried type channel is formed, with respect to the formation of an impurity diffusion layer 6 for controlling a threshold voltage, the dose amount of BF$_2$ to be implanted in the earlier step is previously set at a smaller level, and the impurity concentration of the impurity diffusion layer 6 for controlling a threshold voltage is set at a predetermined value by increase due to the two implantation treatments of boron implantation. On the other hand, in the case where a surface type channel is formed, with respect to the formation of the impurity diffusion layer 6 for controlling a threshold voltage, the dose amount of phosphorus to be implanted in the earlier step is previously set at a larger level, and the impurity concentration of the impurity diffusion layer 6 for controlling a threshold voltage is set at a predetermined value by decrease due to the two implantation treatments of boron implantation. The impurity diffusion layer 4 is set at a predetermined impurity concentration by one implantation treatment. These points are similar to those in the case of conducting the similar treatment in the other embodiments.

Figure 8H:
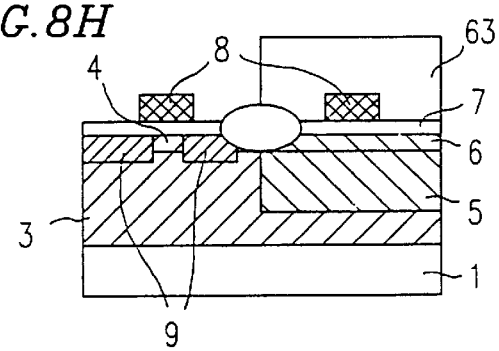
Figure 8D:
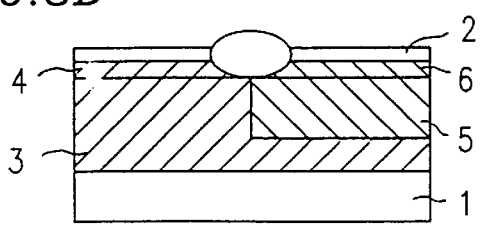
Figure 8I:
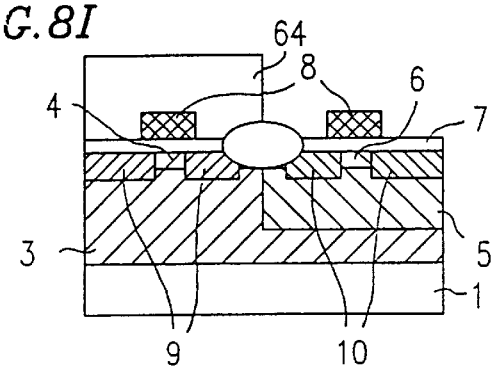
Figure 8E:
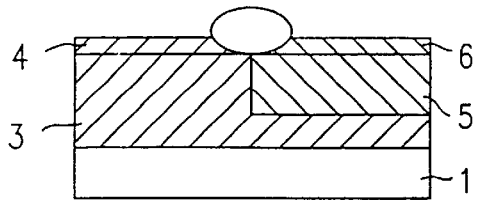

Next, in the step shown in FIG. 8D, a heat treatment (RTA treatment) is conducted at a temperature of 1000° C. for 10 seconds, whereby point defects such as interstitial silicon and vacancy generated during the above-mentioned ion implantation are diffused. Furthermore, after the protective oxide film 2 is removed as shown in FIG. 8E, a gate oxide film 7 is formed by a heat treatment at a temperature of 850° C. for 30 minutes, as shown in FIG. 8F. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Furthermore, as shown in FIG. 8G, gate electrodes 8 are selectively formed on the gate oxide film 7. Next, as shown in FIG. 8H, a mask 63 covering the n-type well 5 is formed, and arsenic is implanted at an acceleration voltage of 50 keV and a dose amount of $2.0 \times 10^{15}$ cm$^{-2}$, utilizing the gate electrodes 8 and the mask 63, whereby source/drain regions 9 of an n-MOSFET are formed. Furthermore, after the mask 63 is removed, as shown in FIG. 8I, a mask 64 covering a portion in the p-type well 3 which is not overlapped with the n-type well 5 is formed, and BF$_2$ is implanted at an acceleration voltage of 30 keV and a dose amount of $2.0 \times 10^{15}$ cm$^{-2}$, utilizing the gate electrodes 8 and the mask 64, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of BF$_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

Embodiment 3

FIGS. 9A through 9I are cross-sectional views showing each process step in a method for producing a semiconductor device in accordance with the third embodiment of the present invention.

First, as shown in FIG. 9A, a p-type low concentration substrate 1 is thermally oxidized to form a protective oxide film 2 for ion implantation. In the figure, the reference numeral 50 denotes an insulation separating region for device separation.

Next, as shown in FIG. 9B, a mask 61 is selectively formed on the protective oxide film 2, and phosphorus is implanted at an acceleration voltage of 400 keV and a dose amount of $1.0 \times 10^{13}$ cm$^{-2}$, utilizing the mask 61, whereby a retrograde n-type well 5 is formed. Furthermore, phosphorus for forming a punch-through stop layer is implanted at an acceleration voltage of 160 keV and a dose amount of $6.0 \times 10^{12}$ cm$^{-2}$, using the same mask 61, and BF$_2$ for forming an impurity diffusion layer 6 for controlling a threshold voltage is implanted at an acceleration voltage of 70 keV and a dose amount of $6.6 \times 10^{12}$ cm$^{-2}$. Thus, a buried type channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ cm$^{-2}$.

Next, as shown in FIG. 9C, boron is implanted at an acceleration voltage of 700 keV and a dose amount of $4.4 \times 10^{12}$ cm$^{-2}$ by further using the mask 61, whereby a retrograde p-type well 3 is formed. At this time, due to the high-energy ion implantation, the p-type well 3 is formed so as to have a peak of an impurity concentration in a deep portion of the substrate in a region which is not covered with the mask 61. On the other hand, ions are implanted at a speed reduced by the mask 61 in a region which is covered with the mask 61, so that the p-type well 3 is formed in a shallower position. The p-type well 3 is formed so as to surround the n-type well 5, resulting in a structure having outstanding durability against latchup.

Furthermore, boron for forming a channel stop layer is implanted at an acceleration voltage of 160 keV and a dose amount of $6.0 \times 10^{12}$ cm$^{-2}$. Subsequently, after the mask 61 is removed, boron for forming the impurity diffusion layer 4 for controlling a threshold voltage is implanted at an acceleration voltage of 30 keV and a dose amount of $4.7 \times 10^{12}$ cm$^{-2}$.

Next, in the step shown in FIG. 9D, a heat treatment (RTA treatment) is conducted at a temperature of 1000° C. for 10 seconds, whereby point defects such as interstitial silicon and vacancy generated during the above-mentioned ion implantation are diffused. Furthermore, after the protective oxide film 2 is removed as shown in FIG. 9E, a gate oxide film 7 is formed by a heat treatment at a temperature of 850° C. for 30 minutes, as shown in FIG. 9F. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Furthermore, as shown in FIG. 9G, gate electrodes 8 are selectively formed on the gate oxide film 7. Next, as shown in FIG. 9H, a mask 73 covering the n-type well 5 is formed, and arsenic is implanted at an acceleration voltage of 50 keV and a dose amount of $2.0 \times 10^{15}$ cm$^{-2}$, utilizing the gate electrodes 8 and the mask 73, whereby source/drain regions 9 of an n-MOSFET are formed. Furthermore, after the mask 73 is removed, as shown in FIG. 9I, a mask 74 covering a portion in the p-type well 3 which is not overlapped with the n-type well 5 is formed, and BF$_2$ is implanted at an acceleration voltage of 30 keV and a dose amount of $2.0 \times 10^{15}$ cm$^{-2}$, utilizing the gate electrodes 8 and the mask 74, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of BF$_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

Embodiment 4

FIGS. 10A through 10I are cross-sectional views showing each process step in a method for producing a semiconductor device in accordance with the fourth embodiment of the present invention.

Figure 10A:
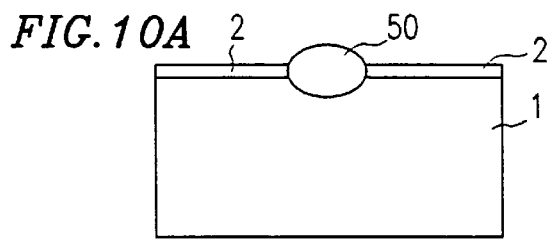
FIGS. 10A through 10I are cross-sectional views showing each process step in a method for producing a semiconductor device in accordance with the fourth embodiment of the present invention.

First, as shown in FIG. 10A, a p-type low concentration substrate 1 is thermally oxidized to form a protective oxide film 2 for ion implantation. In the figure, the reference numeral 50 denotes an insulation separating region for device separation.

Figure 10B:
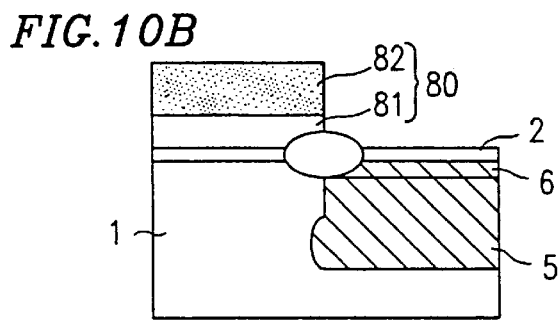

Next, as shown in FIG. 10B, a mask 80 with a two-layer structure including a lower mask 81 made of, for example, a silicon nitride film and an upper mask 82 made of, for example, a resist is selectively formed on the protective oxide film 2. Phosphorus is implanted at an acceleration voltage of 400 keV and a dose amount of $1.0 \times 10^{13}$ cm$^{-2}$, utilizing the mask 80, whereby a retrograde n-type well 5 is formed. Furthermore, phosphorus for forming a punch-through stop layer is implanted at an acceleration voltage of 160 keV and a dose amount of $6.0 \times 10^{12}$ cm$^{-2}$, using the same mask 80, and BF$_2$ for forming an impurity diffusion layer 6 for controlling a threshold voltage is implanted at an acceleration voltage of 70 keV and a dose amount of $6.6 \times 10^{12}$ cm$^{-2}$. Thus, a buried type channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ cm$^{-2}$.

Figure 10C:
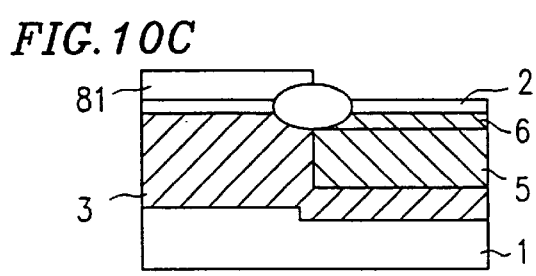

Next, only the upper mask 82 of the mask 80 is removed, and boron is implanted at an acceleration voltage of 700 keV and a dose amount of $4.4 \times 10^{12}$ cm$^{-2}$, using only the lower mask 81 as shown in FIG. 10C, whereby a retrograde p-type well 3 is formed. At this time, due to the high-energy ion implantation, the p-type well 3 is formed so as to have a peak of an impurity concentration in a deep portion of the substrate in a region which is not covered with the mask 81. On the other hand, ions are implanted at a speed reduced by the mask 81 in a region which is covered with the mask 81, so that the p-type well 3 is formed in a shallower position. The p-type well 3 is formed so as to surround the n-type well 5, resulting in a structure having outstanding durability against latchup.

Furthermore, boron for forming a channel stop layer is implanted at an acceleration voltage of 160 keV and a dose amount of $6.0 \times 10^{12}$ cm$^{-2}$. Thereafter, the lower mask 81 is removed, and boron for forming the impurity diffusion layer 4 for controlling a threshold voltage is implanted at an acceleration voltage of 30 keV and a dose amount of $4.7 \times 10^{12}$ cm$^{-2}$.

Figure 10D:
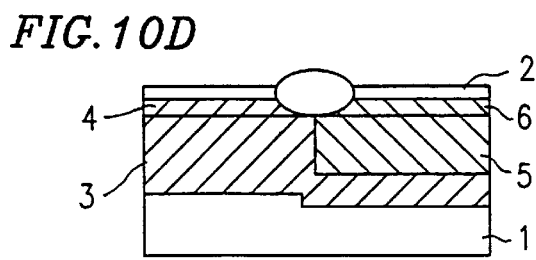
Figure 10E:
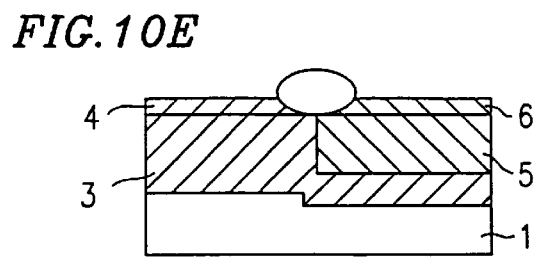
Figure 10F:
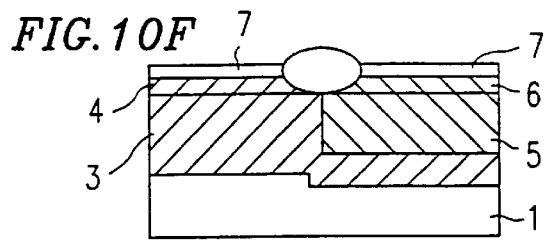

Next, in the step shown in FIG. 10D, a heat treatment (RTA treatment) is conducted at a temperature of 1000° C. for 10 seconds, whereby point defects such as interstitial silicon and vacancy generated during the above-mentioned ion implantation are diffused. Furthermore, after the protective oxide film 2 is removed as shown in FIG. 10E, a gate oxide film 7 is formed by a heat treatment at a temperature of 850° C. for 30 minutes, as shown in FIG. 10F. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Figure 10G:
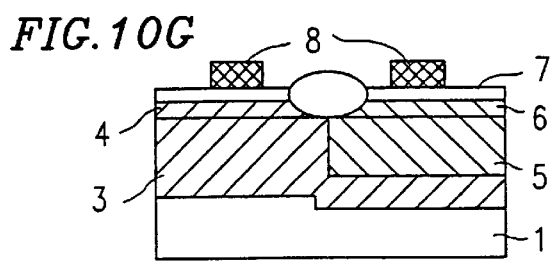
Figure 10H:
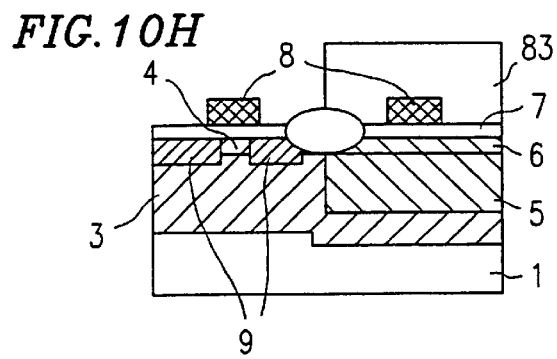
Figure 10I:
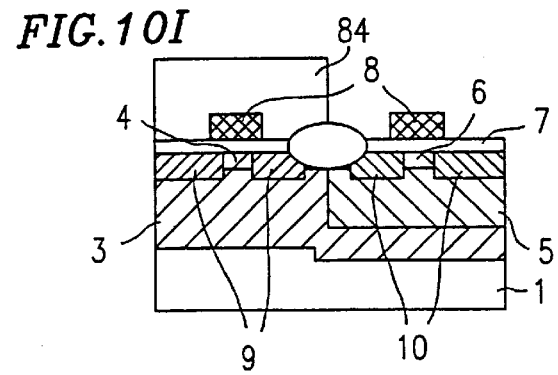

Furthermore, as shown in FIG. 10G, gate electrodes 8 are selectively formed on the gate oxide film 7. Next, as shown in FIG. 10H, a mask 83 covering the n-type well 5 is formed, and arsenic is implanted at an acceleration voltage of 50 keV and a dose amount of $2.0 \times 10^{15}$ cm$^{-2}$, utilizing the gate electrodes 8 and the mask 83, whereby source/drain regions 9 of an n-MOSFET are formed. Furthermore, after the mask 83 is removed, as shown in FIG. 10I, a mask 84 covering a portion in the p-type well 3 which is not overlapped with the n-type well 5 is formed, and BF$_2$ is implanted at an acceleration voltage of 30 keV and a dose amount of $2.0 \times 10^{15}$ cm$^{-2}$, utilizing the gate electrodes 8 and the mask 84, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of BF$_2$, and when a surface channel-type p-MOSFET is formed, the impurity diffusion layer 6 for controlling a threshold voltage is formed by implantation of phosphorus. On the other hand, an N-MOSFET becomes a surface channel-type by implantation of boron.

Embodiment 5

FIGS. 11A through 11K are cross-sectional views showing each process step in a method for producing a semiconductor device in accordance with the fifth embodiment of the present invention. More specifically, a triple-well structure is formed by the production method of the present embodiment.

First, as shown in FIG. 11A, a p-type low concentration substrate 1 is thermally oxidized to form a protective oxide film 2 for ion implantation. In the figure, the reference numeral 50 denotes an insulation separating region for device separation.

Next, as shown in FIG. 11B, a mask 91 is selectively formed on the protective oxide film 2, and phosphorus is implanted at an acceleration voltage of 1500 keV and a dose amount of 2.0×10$^{12}$ cm$^{-2}$, utilizing the mask 91, whereby an n-type buried layer 11 having a peak of an impurity concentration at a position represented by a broken line is formed.

Subsequently, after the mask 91 is removed, a new mask 92 as shown in FIG. 11C is selectively formed on the protective oxide film 2, and boron is implanted at an acceleration voltage of 400 keV and a dose amount of 1.0×10$^{13}$ cm$^{-2}$, whereby a retrograde p-type well 3 is formed. Furthermore, boron for forming a channel stop layer is implanted at an acceleration voltage of 160 keV and a dose amount of 6.0×10$^{12}$ cm$^{-2}$, using the same mask 92, and boron for forming an impurity diffusion layer 4 for controlling a threshold voltage is implanted at an acceleration voltage of 30 keV and a dose amount of 2.7×10$^{12}$ cm$^{-2}$.

Next, the mask 92 is removed, and a new mask 93 is selectively formed on the protective oxide film 2, as shown in FIG. 11D. The mask 93 is patterned so as to cover a portion which is not covered with the mask 92. Then, phosphorus is implanted at an acceleration voltage of 850 keV and a dose amount of 1.0×10$^{13}$ cm$^{-2}$, whereby a retrograde n-type well 5 is formed. The n-type well 5 has a peak of an impurity concentration at a position represented by a broken line, and is formed so as to be connected to a deep buried layer 11 and to surround the p-type well 3.

Furthermore, phosphorus for forming a punch-through stop layer is implanted at an acceleration voltage of 400 keV and a dose amount of 3.0×10$^{12}$ cm$^{-2}$, using the same mask 93, and BF$_2$ for forming the impurity diffusion layer 6 for controlling a threshold voltage is implanted at an acceleration voltage of 70 keV and a dose amount of 3.0×10$^{12}$ cm$^{-2}$. Thus, a buried channel is formed. Alternatively, in the case where a surface type channel is formed, the impurity diffusion layer 6 for controlling a threshold voltage is formed by implanting phosphorus at an acceleration voltage of 40 keV and a dose amount of 3.0×10$^{12}$ cm$^{-2}$.

Next, the mask 93 is removed, and a new mask 94 is selectively formed on the protective oxide film 2, as shown in FIG. 11E. The mask 94 is patterned so as to cover a region where the n-type well 5 and the deep n-type buried layer 11 are formed. Then, boron is additionally implanted into a portion of the impurity diffusion layer 4 for controlling a threshold voltage present in the p-type well 3 through an opening of the mask 94 at an acceleration voltage of 30 keV and a dose amount of 2.0×10$^{12}$ cm$^{-2}$. The additional implantation will be described in detail in conjunction with the description of the subsequent embodiment.

Figure 11G:
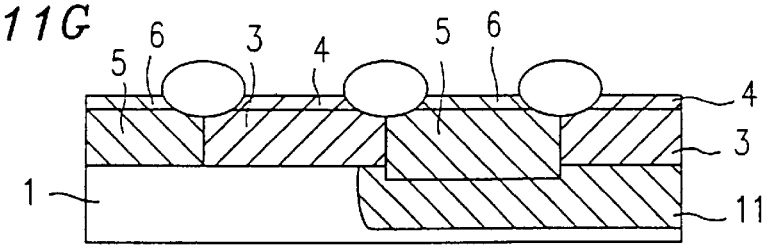
Figure 11H:
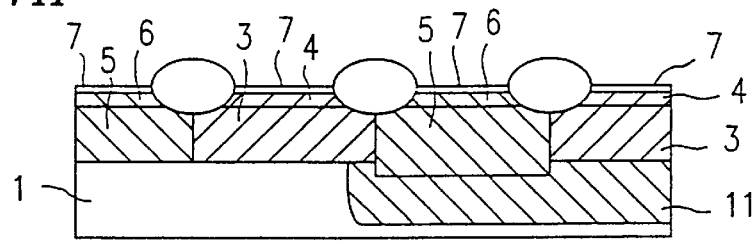

Then, the mask 94 is removed as shown in FIG. 11F, and point defects such as interstitial silicon and vacancy generated during the above-mentioned ion implantation are diffused by conducting the heat treatment (RTA treatment) at a temperature of 1000° C. for 10 seconds. Furthermore, after the protective oxide film 2 is removed as shown in FIG. 11G, a gate oxide film 7 is formed by a heat treatment at a temperature of 850° C. for 30 minutes, as shown in FIG. 11H. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Figure 11I:
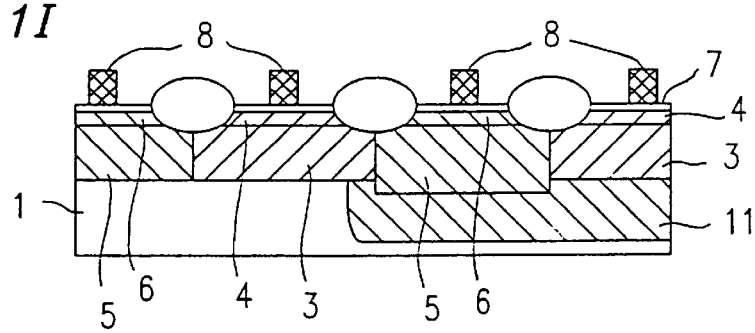
Figure 11J:
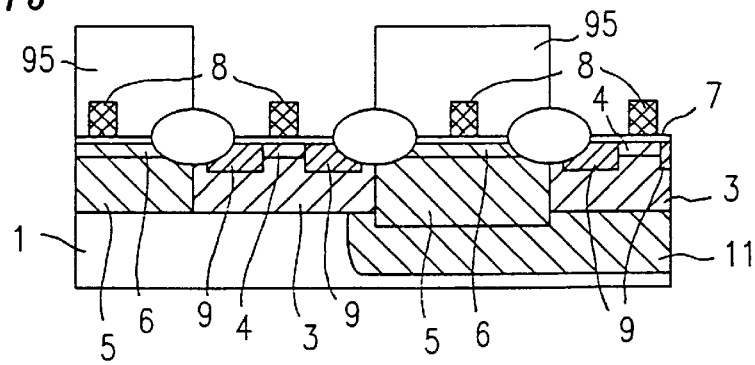
Figure 11K:
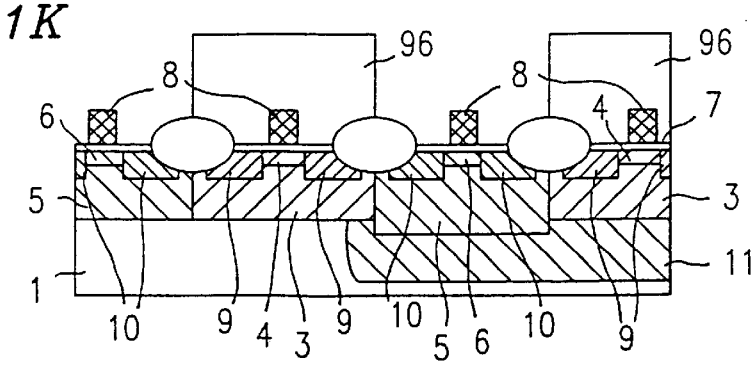

Furthermore, as shown in FIG. 11I, gate electrodes 8 are selectively formed on the gate oxide film 7. Next, as shown in FIG. 11J, a mask 95 covering a region other than the p-type well 3 is formed, and arsenic is implanted at an acceleration voltage of 50 keV and a dose amount of 2.0×10$^{15}$ cm$^{-2}$, utilizing the gate electrodes 8 and the mask 95, whereby source/drain regions 9 of an n-MOSFET are formed. Furthermore, after the mask 95 is removed, as shown in FIG. 11K, a mask 96 covering the p-type well 3 is formed, and BF$_2$ is implanted at an acceleration voltage of 30 keV and a dose amount of 2.0×10$^{15}$ cm$^{-2}$, utilizing the gate electrodes 8 and the mask 96, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of BF$_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

Embodiment 6

FIGS. 12A through 12K are cross-sectional views showing each process step in a method for producing a semiconductor device in accordance with the sixth embodiment of the present invention. More specifically, a triple-well structure is formed by the production method of the present embodiment.

Figure 12A:
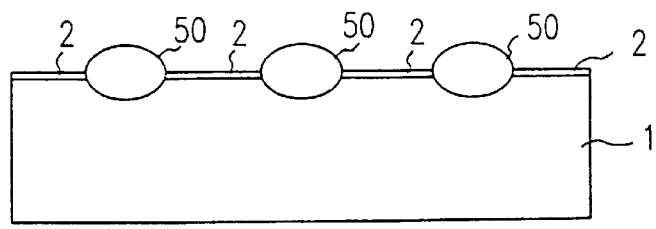
FIGS. 12A through 12K are cross-sectional views showing each process step in a method for producing a semiconductor device in accordance with the sixth embodiment of the present invention.

First, as shown in FIG. 12A, a p-type low concentration substrate 1 is thermally oxidized to form a protective oxide film 2 for ion implantation. In the figure, the reference numeral 50 denotes an insulation separating region for device separation.

Figure 12B:
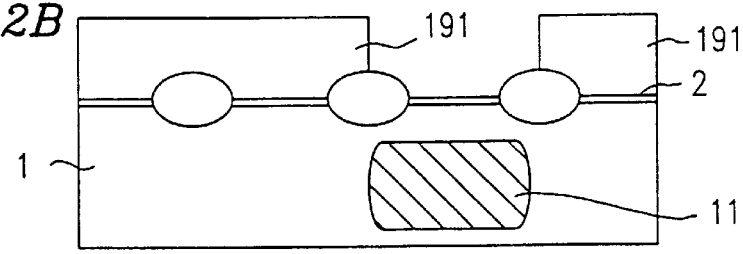

Next, as shown in FIG. 12B, a mask 191 is selectively formed on the protective oxide film 2, and phosphorus is implanted at an acceleration voltage of 1500 keV and a dose amount of $2.0 \times 10^{12}$ cm$^{-2}$, utilizing the mask 191, whereby a deep n-type buried layer 11 is formed.

Figure 12C:
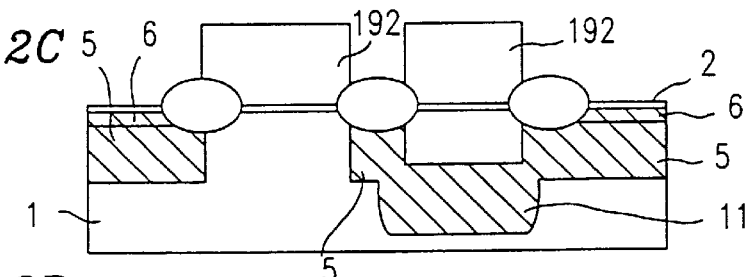

Subsequently, after the mask 191 is removed, a new mask 192 as shown in FIG. 12C is selectively formed on the protective oxide film 2, and phosphorus is implanted at an acceleration voltage of 850 keV and a dose amount of $1.0 \times 10^{13}$ cm$^{-2}$, whereby a retrograde n-type well 5 is formed. Furthermore, phosphorus for forming a punch-through stop layer is implanted at an acceleration voltage of 400 keV and a dose amount of $3.0 \times 10^{12}$ cm$^{-2}$, using the same mask 192, and BF$_2$ for forming an impurity diffusion layer 6 for controlling a threshold voltage is implanted at an acceleration voltage of 70 keV and a dose amount of $3.0 \times 10^{12}$ cm$^{-2}$. Thus, a buried type channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ cm$^{-2}$.

Figure 12D:
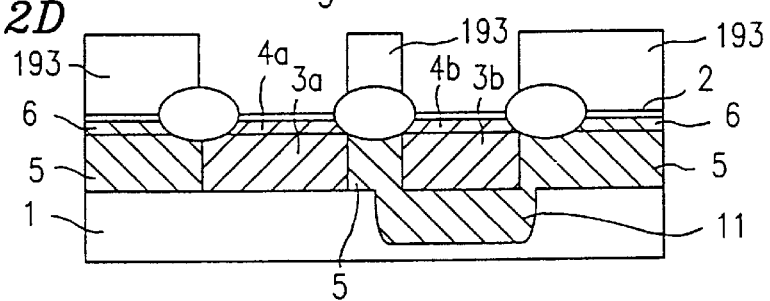

Next, the mask 192 is removed, and a new mask 193 is selectively formed on the protective oxide film 2, as shown in FIG. 12D. The mask 193 is patterned so as to cover a portion which is not covered with the mask 192. Then, boron is implanted at an acceleration voltage of 400 keV and a dose amount of $1.0 \times 10^{13}$ cm$^{-2}$, whereby retrograde p-type wells 3a and 3b are formed. Furthermore, boron for forming a channel stop layer is implanted at an acceleration voltage of 160 keV and a dose amount of $6.0 \times 10^{12}$ cm$^{-2}$, using the same mask 193, and boron for forming impurity diffusion layers 4a and 4b for controlling a threshold voltage is implanted at an acceleration voltage of 30 keV and a dose amount of $2.7 \times 10^{12}$ cm$^{-2}$.

Figure 12E:
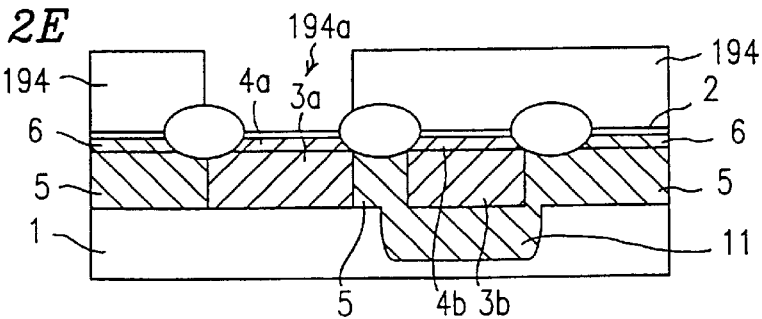

Next, the mask 193 is removed, and a new mask 194 is selectively formed on the protective oxide film 2, as shown in FIG. 12E. The mask 194 is patterned so as to cover a region where the n-type well 5 and the deep n-type buried layer 11 are formed. Then, boron is additionally implanted into the impurity diffusion layer 4a for controlling a threshold voltage present on the portion 3a of the p-type well through an opening 194a of the mask 194 at an acceleration voltage of 30 keV and a dose amount of $2.0 \times 10^{12}$ cm$^{-2}$.

In a DRAM having a triple-well structure as formed by the production method of the present embodiment, an n-MOSFET in the p-type well 3b, surrounded by the n-type well 5 and insulated from the substrate 1 having a p-type conductivity, corresponds to a cell portion. Furthermore, an n-MOSFET in the p-type well 3a having the same electric potential as that of the substrate 1 and a p-MOSFET in the n-type well 5 respectively correspond to peripheral circuit portions. The cell portion is operated based on a substrate potential, so that it is required to prescribe the concentration of the impurity diffusion layer 4a for controlling a threshold voltage formed in the p-type well 3a having the same electric potential as that of the p-type substrate 1 to be higher than that of the impurity diffusion layer 4b for controlling a threshold voltage formed in the p-type well 3b surrounded by the n-type well 5 to be insulated from the substrate 1. Thus, herein, impurities for controlling a threshold voltage are additionally implanted into the p-type well 3a having the same electric potential as that of the p-type substrate 1.

On the other hand, in a logic chip or the like, an n-MOSFET provided in the p-type well 3a having the same electric potential as that of the p-type substrate 1 is sometimes operated at a low voltage. In this case, contrary to the above-mentioned case, it is required to prescribe the concentration of the impurity diffusion layer 4b for controlling a threshold voltage formed in the p-type well 3b, surrounded by the n-type well 5 to be insulated from the substrate 1, to be higher than that of the impurity diffusion layer 4a for controlling a threshold voltage formed in the p-type well 3a having the same electric potential as that of the p-type substrate 1. In order to do this, the mask 194 shown in FIG. 12E should be patterned to have the opening 194a on the p-type well 3b surrounded by the n-type well 5 to be insulated from the p-type substrate 1.

Figure 12F:
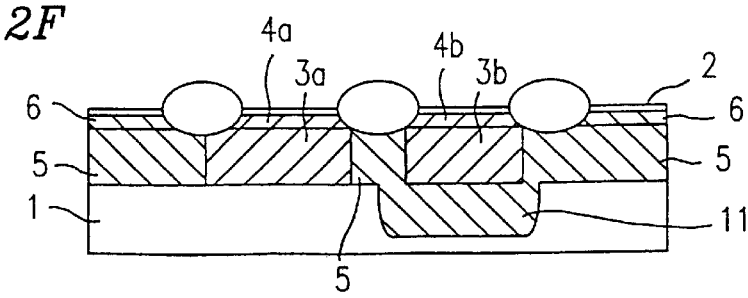

Next, the mask 194 is removed as shown in FIG. 12F, and a heat treatment (RTA treatment) is conducted at a temperature of 1000° C. for 10 seconds, whereby point defects such as interstitial silicon and vacancy generated during the above ion implantation are diffused. Even in the case of conducting three kinds of implantation steps for controlling a threshold voltage and three kinds of forming steps of well layers and buried layers as in the present embodiment, a heat treatment can be conducted after the implantation step for controlling a threshold voltage; more specifically, an RTA treatment is conducted according to the present invention.

Figure 12G:
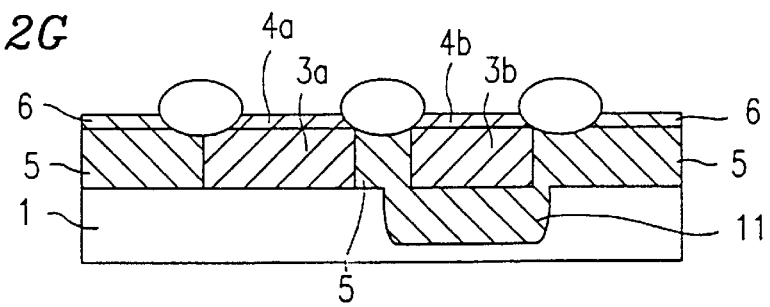
Figure 12H:
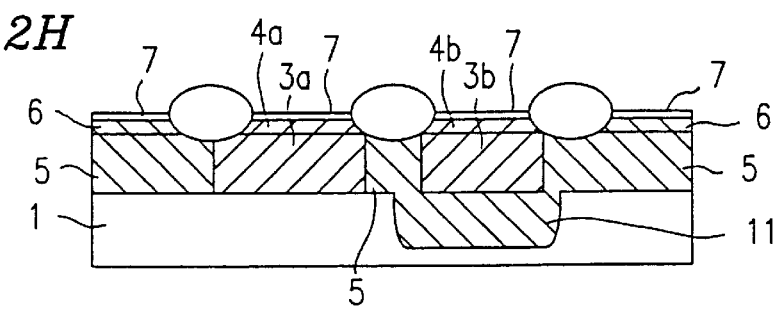

Furthermore, as shown in FIG. 12G, the protective oxide film 2 is removed, and thereafter, a gate oxide film 7 is formed by a heat treatment at a temperature of 850° C. for 30 minutes, as shown in FIG. 12H. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Figure 12I:
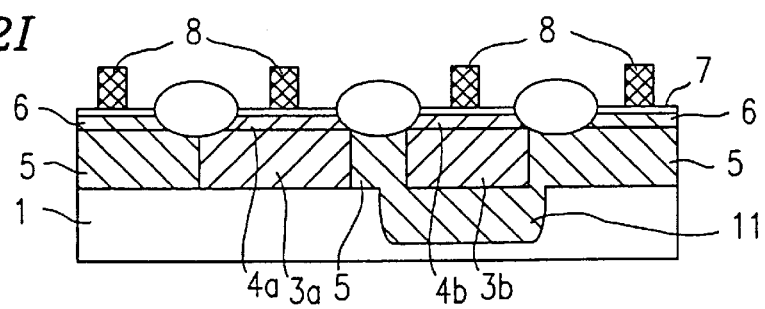
Figure 12J:
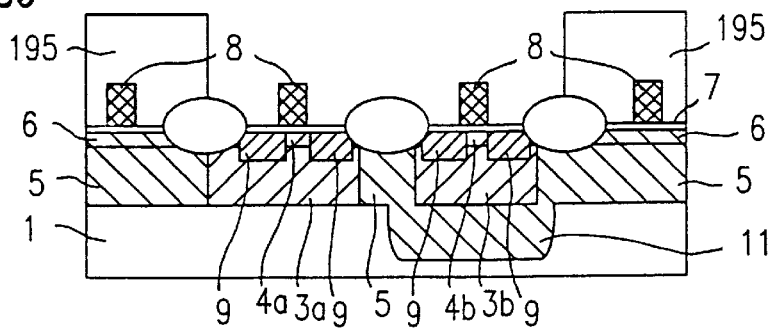
Figure 12K:
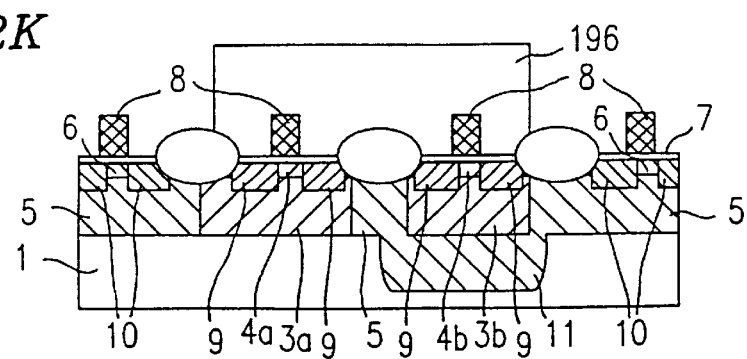

Furthermore, as show n in FIG. 12I, gate electrodes 8 are selectively formed on the gate oxide film 7. Next, as shown in FIG. 12J, a mask 195 is formed, and arsenic is implanted at an acceleration voltage of 50 keV and a dose amount of $2.0 \times 10^{15}$ cm$^{-2}$, utilizing the gate electrodes 8 and the mask 195, whereby source/drain regions 9 of an n-MOSFET are formed. Furthermore, after the mask 195 is removed, as shown in FIG. 12K, a mask 196 is formed, and BF$_2$ is implanted at an acceleration voltage of 30 keV and a dose amount of $2.0 \times 10^{15}$ cm$^{-2}$, utilizing the gate electrodes 8 and the mask 196, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of $BF_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

Embodiment 7

FIGS. 13A through 13K are cross-sectional views showing each process step in a method for producing a semiconductor device in accordance with the seventh embodiment of the present invention. More specifically, in the present embodiment, a high-energy ion implantation treatment through a mask as disclosed in, for example, U.S. Pat. No. 5,160,996, is applied to the production process described in the sixth embodiment, whereby the number of masks to be used is reduced.

First, as shown in FIG. 13A, a p-type low concentration substrate 1 is thermally oxidized to form a protective oxide film 2 for ion implantation. In the figure, the reference numeral 50 denotes an insulation separating region for device separation.

Next, as shown in FIG. 13B, a mask 191 is selectively formed on the protective oxide film 2, and phosphorus is implanted at an acceleration voltage of 1500 keV and a dose amount of $2.0 \times 10^{12}$ $cm^{-2}$, utilizing the mask 191, whereby a deep n-type buried layer 11 is formed. Furthermore, boron for forming the impurity diffusion layer 4 for controlling a threshold voltage is implanted at an acceleration voltage of 30 keV and a dose amount of $2.7 \times 10^{12}$ $cm^{-2}$, utilizing the same mask 191.

Then, after the mask 191 is removed, a new mask 192 as shown in FIG. 13C is selectively formed on the protective oxide film 2, and phosphorus is implanted at an acceleration voltage of 850 keV and a dose amount of $1.0 \times 10^{13}$ $cm^{-2}$, whereby an n-type well 5 is formed. Furthermore, phosphorus for forming a punch-through stop layer is implanted at an acceleration voltage of 400 keV and a dose amount of $3.0 \times 10^{12}$ $cm^{-2}$, using the same mask 192, and $BF_2$ for forming an impurity diffusion layer 6 for controlling a threshold voltage is implanted at an acceleration voltage of 70 keV and a dose amount of $3.0 \times 10^{12}$ $cm^{-2}$. Thus, a buried type channel is formed. Alternatively, in the case where a surface type channel is formed, the impurity diffusion layer 6 for controlling a threshold voltage is formed by implanting phosphorus at an acceleration voltage of 40 keV and a dose amount of $3.0 \times 10^{12}$ $cm^{-2}$.

Next, as shown in FIG. 13D, boron is implanted at an acceleration voltage of 400 keV and a dose amount of $1.0 \times 10^{13}$ $cm^{-2}$, utilizing the same mask 192, whereby a retrograde p-type well 3 and a deep p-type buried layer 130 are formed. At this time, due to the high-energy ion implantation, the p-type buried layer 130 is formed so as to have a peak of an impurity concentration in a deep portion of the substrate in a region which is not covered with the mask 192. On the other hand, ions are implanted at a speed reduced by the mask 192 in a region which is covered with the mask 192, so that the p-type well 3 is formed in a shallower position.

Furthermore, boron for forming a channel stop layer is implanted at an acceleration voltage of 160 keV and a dose amount of $6.0 \times 10^{12}$ $cm^{-2}$, using the same mask 192.

Next, after the mask 192 is removed, and a new mask 194 is selectively formed on the protective oxide film 2, as shown in FIG. 13E. The mask 194 is patterned so as to cover a region where the n-type well 5 and the deep n-type buried layer 11 are formed. Boron for forming the impurity diffusion layer 4 for controlling a threshold voltage is implanted at an acceleration voltage of 30 keV and a dose amount of $2.7 \times 10^{12}$ $cm^{-2}$.

Figure 13G:
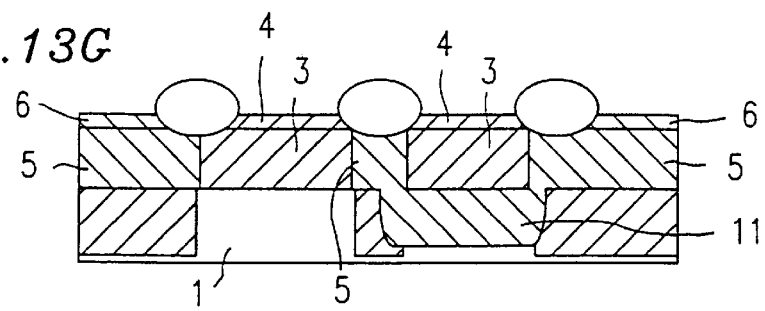
Figure 13H:
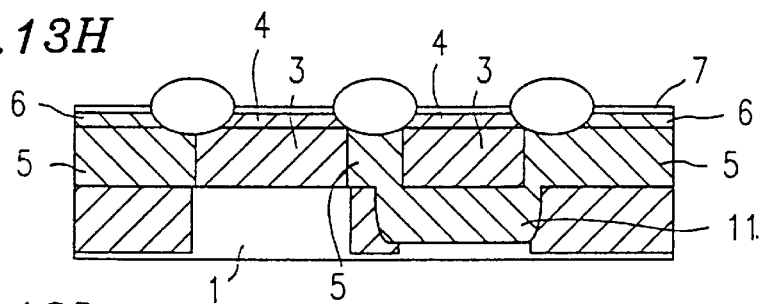

Next, as shown in FIG. 13F, the mask 194 is removed, and a heat treatment (RTA treatment) is conducted at a temperature of 1000° C. for 10 seconds, whereby point defects such as interstitial silicon and vacancy generated during the above-mentioned ion implantation are diffused. Furthermore, after the protective oxide film 2 is removed as shown in FIG. 13G, a gate oxide film 7 is formed by a heat treatment at a temperature of 850° C. for 30 minutes, as shown in FIG. 13H. Even when such a heat treatment for forming the gate oxide film 7 is conducted, since the point defects have been eliminated by the above-mentioned RTA treatment, extraordinary diffusion caused by the point defects is suppressed, and retrograde impurity concentration distributions of the impurity diffusion layers 4 and 6 are maintained. Furthermore, since the RTA treatment is conducted before forming the gate oxide film 7, defects are eliminated in the vicinity of the surface of the substrate, and thus, the gate oxide film 7 having a satisfactory film quality can be formed.

Figure 13I:
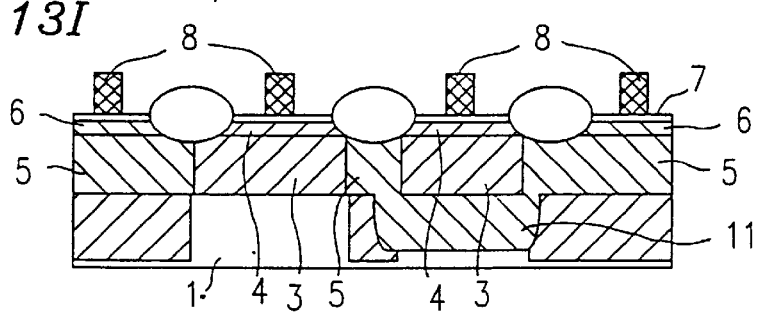
Figure 13J:
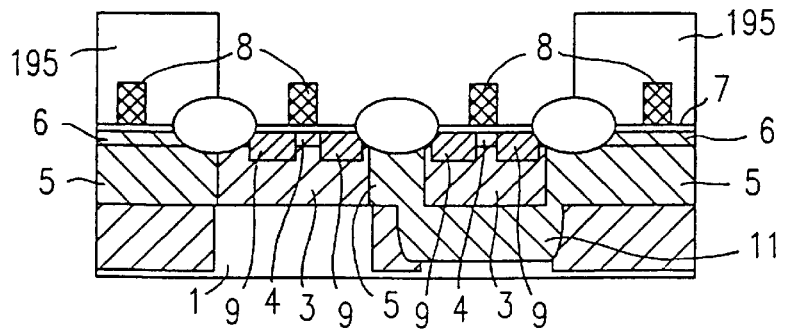
Figure 13K:
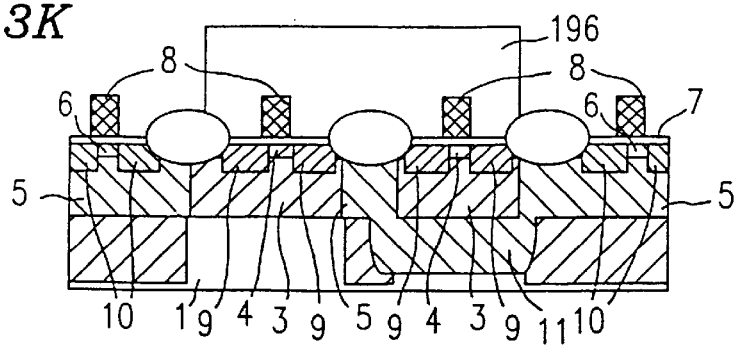

Furthermore, as shown in FIG. 13I, gate electrodes 8 are selectively formed on the gate oxide film 7. Next, as shown in FIG. 13J, a mask 195 is formed, and arsenic is implanted at an acceleration voltage of 50 keV and a dose amount of $2.0 \times 10^{15}$ $cm^{-2}$, utilizing the gate electrodes 8 and the mask 195, whereby source/drain regions 9 of an n-MOSFET are formed. Furthermore, after the mask 195 is removed, as shown in FIG. 13K, a mask 196 is formed, and $BF_2$ is implanted at an acceleration voltage of 30 keV and a dose amount of $2.0 \times 10^{15}$ $cm^{-2}$, utilizing the gate electrodes 8 and the mask 196, whereby source/drain regions 10 of a p-MOSFET are formed.

Thereafter, by the RTA treatment (e.g., at a temperature of about 1000° C. for about 10 seconds), point defects in the source/drain regions are eliminated, and the source/drain regions are activated. The heat treatment conducted herein is also an RTA heat treatment, which can prevent the source/drain regions from being enlarged due to diffusion, so that the miniaturization of the MOSFETs to be formed can be realized.

As described above, according to the method for producing a semiconductor device of the present invention, when a buried channel-type p-MOSFET is formed, the impurity diffusion layer 6 for controlling a threshold voltage is formed by implantation of $BF_2$, and when a surface channel-type p-MOSFET is formed, the impurity diffusion layer 6 for controlling a threshold voltage is formed by implantation of phosphorus. On the other hand, an n-MOSFET becomes a surface channel-type by implantation of boron.

According to the method for producing a semiconductor device of the present invention as described above, each of the implantation step for forming a well and the implantation step for controlling a threshold voltage can be conducted by using the same mask. Two implantation steps for the above-mentioned purposes are followed by a heat treatment (RTA treatment) for diffusing interstitial silicon generated during the well formation, and thereafter, a heat oxidation step for forming a gate oxide film is conducted.

Figure 14:
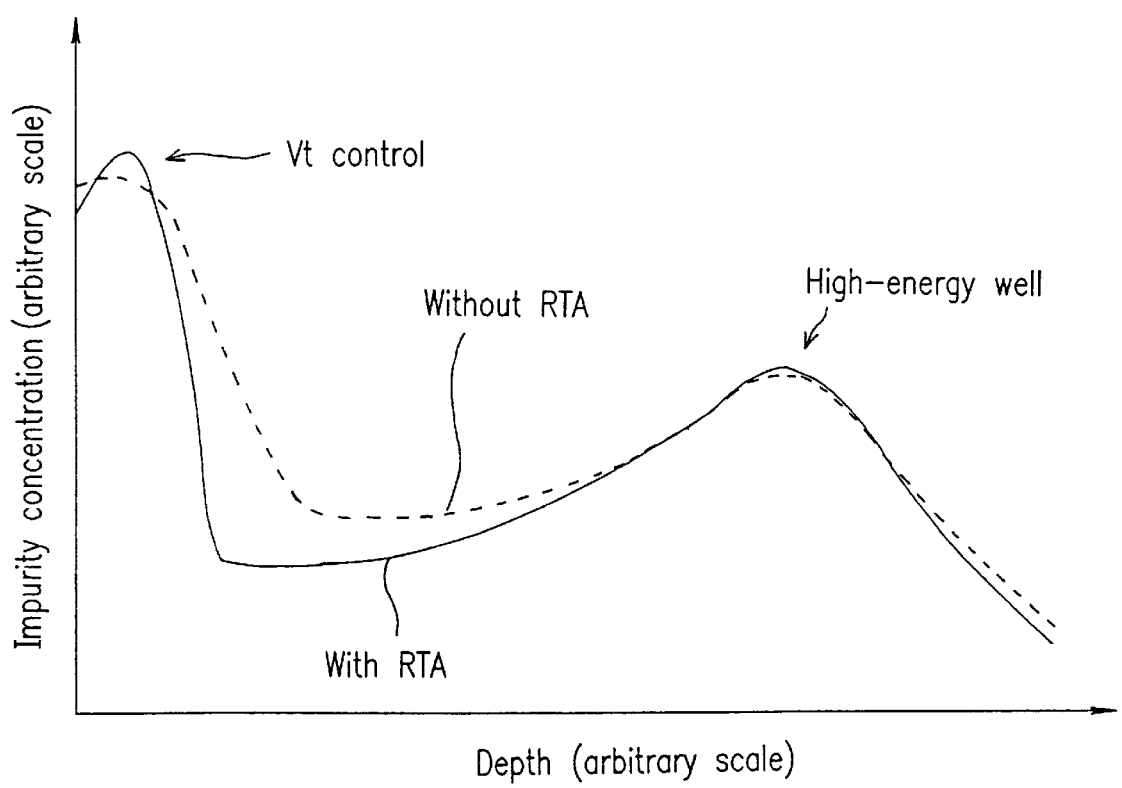
FIG. 14 is a view schematically showing an impurity distribution in a depth direction after a step of forming a gate oxide film in each of the production process (with RTA) according to the present invention and the conventional production process (without RTA).

Herein, FIG. 14 is a view schematically showing impurity distributions in a depth direction after the step of forming a gate oxide film in the production process (indicated by "with RTA") of the present invention involving the RTA treatment and the production process (indicated by "without RTA") of the prior art not involving the RTA treatment. In the vicinity of the surface, a peak (indicated by "Vt control") corresponding to the impurity diffusion layer for controlling a threshold voltage is present, whereas another peak corresponding a high-energy well is present in the substrate.

In general, the impurities (e.g., boron) implanted for the purpose of controlling a threshold voltage are diffused during the heat oxidation step for forming a gate oxide film. However, the diffusion of the impurities implanted for the purpose of re-distributing the impurities in a well or controlling a threshold voltage can be suppressed by conducting the RTA treatment after the implantation step for forming a well according to the present invention, as shown in FIG. 14. Thus, according to the present invention, the concentration of the impurities in the vicinity of the surface of a well (or a substrate) can be prevented from increasing.

Furthermore, according to the present invention, regarding a buried channel-type MOSFET, a shallow impurity diffusion region for controlling a threshold voltage can be formed, so that a high drive force can be realized, suppressing the deviations of an off-leak current or a threshold voltage. On the other hand, regarding a surface channel-type MOSFET, the impurities for controlling a threshold voltage keep a retrograde distribution shape, so that a high drive force can be realized, suppressing occurrence of the short-channel effect while suppressing the increase in junction capacitance.

INDUSTRIAL APPLICABILITY

According to the method for producing a semiconductor device of the present invention as described above, retrograde n-type well and p-type well, and a diffusion layer for controlling a threshold voltage can be formed by using the same mask pattern, and CMOS operational characteristics can be obtained, in which interstitial silicon generated by high-energy ion implantation does not affect a threshold voltage. Thus, the method for producing a semiconductor device of the present invention makes it possible to achieve a stable and high-performance operation required of a CMOS, which is remarkably valuable from an industrial viewpoint.

What is claimed is:

1. A method for producing a semiconductor device, comprising the steps of:
   selectively forming an insulation separating region on a semiconductor substrate;
   selectively forming a protective film on a surface of the semiconductor substrate;
   implanting ion species into the semiconductor substrate at different energy levels, using the protective film as a mask, thereby forming a well with a first conductivity and an impurity diffusion layer for controlling a threshold voltage;
   implanting ion species into the semiconductor substrate, using the protective film as a mask, thereby forming a well with a second conductivity in a region of the semiconductor substrate which is covered with the protective film, and forming a buried layer with a second conductivity in a region under the well with the first conductivity in such a manner that the well with the second conductivity and the buried layer with the second conductivity are formed adjacent to each other in a high concentration under the insulation separating region so as to surround the well with the first conductivity;
   removing the protective film;
   implanting ion species into an entire surface of the semiconductor substrate, thereby forming an impurity diffusion layer for controlling a threshold voltage in a region of the semiconductor substrate which is covered with the protective film; and
   conducting a high-temperature rapid heat treatment.

2. A method for producing a semiconductor device, comprising the steps of:
   selectively forming an insulation separating region on a semiconductor substrate;
   selectively forming a multi-layer film composed of a first protective film overlapped with a second protective film on a surface of the semiconductor substrate;
   implanting ion species into the semiconductor substrate, using the multi-layer film as a mask, thereby forming a well with a first conductivity;
   removing the second protective film;
   implanting ion species into the semiconductor substrate, using the first protective film as a mask, thereby forming a well with a second conductivity in a region of the semiconductor substrate which is covered with the first protective film, and forming a buried layer with a second conductivity in a region under the well with the first conductivity in such a manner that the well with the second conductivity and the buried layer with the second conductivity are formed adjacent to each other in a high concentration under the insulation separating region so as to surround the well with the first conductivity;
   implanting ions into the semiconductor substrate, using the first protective film as a mask;
   removing the first protective film;
   implanting ions into an entire surface of the semiconductor substrate; and
   conducting a high-temperature rapid heat treatment.

3. A method for producing a semiconductor device, comprising the steps of:
   selectively forming a first protective film on a surface of a semiconductor substrate;
   implanting ion species into the semiconductor substrate, using the first protective film as a mask, thereby forming a deep buried layer with a first conductivity;
   removing the first protective film;
   selectively forming a second protective film on a surface of the semiconductor substrate;
   implanting ion species into the semiconductor substrate at different energy levels, using the second protective film as a mask, thereby forming a well and an impurity diffusion layer for controlling a threshold voltage with a second conductivity;
   removing the second protective film;
   selectively forming a third protective film in a region on the surface of the semiconductor substrate which is not covered with the second protective film;
   implanting ion species into the semiconductor substrate, using the third protective film as a mask, thereby forming a well with the first conductivity in a region of the semiconductor substrate which is not covered with the third protective film in such a manner that the well with the first conductivity and the buried layer with the first conductivity are formed adjacent to each other so as to surround the well with the second conductivity;
   implanting ion species into the semiconductor substrate, using the third protective film as a mask, thereby forming an impurity diffusion layer for controlling a threshold voltage;

removing the third protective film;

selectively forming a fourth protective film on the surface of the semiconductor substrate;

implanting ions into the semiconductor substrate, using the fourth protective film as a mask, thereby forming an impurity diffusion layer for controlling a threshold voltage in the well with the second conductivity; and conducting a high-temperature rapid heat treatment.

4. A method for producing a semiconductor device, comprising the steps of:

selectively forming a first protective film on a surface of a semiconductor substrate;

implanting ion species into the semiconductor substrate at different energy levels, using the first protective film as a mask, thereby forming a deep buried layer and an impurity diffusion layer for controlling a threshold voltage with a first conductivity;

removing the first protective film;

selectively forming a second protective film on a surface of the semiconductor substrate;

implanting ion species into the semiconductor substrate at different energy levels, using the second protective film as a mask, thereby forming, adjacent to the deep buried layer with the first conductivity, a well and an impurity diffusion layer for controlling a threshold voltage with a first conductivity in a region of the semiconductor substrate which is not covered with the second protective film;

removing the second protective film;

selectively forming a third protective film on the surface of the semiconductor substrate;

implanting ion species into the semiconductor substrate, using the third protective film as a mask, thereby forming an impurity diffusion layer for controlling a threshold voltage;

removing the third protective film; and conducting a high-temperature rapid heat treatment.

5. A method for producing a semiconductor device according to claim 1, wherein treatment conditions for the high-temperature rapid heat treatment are set in such a manner that interstitial atoms causing the crystal defects are diffused and impurities in the impurity diffusion layer are not diffused.

6. A method for producing a semiconductor device according to claim 1, wherein the high-temperature rapid heat treatment is conducted in a temperature range of about 900° C. to about 1100° C.

7. A method for producing a semiconductor device according to claim 1, wherein an impurity concentration in a vicinity of a surface of a substrate is about $2 \times 10^{17}$ cm$^{-3}$ or less.

8. A method for producing a semiconductor device according to claim 1, wherein a temperature increase rate during the high-temperature heat treatment step is in a range of about 50° C./sec. to about 400° C./sec.

9. A method for producing a semiconductor device according to claim 2, wherein treatment conditions for the high-temperature rapid heat treatment are set in such a manner that interstitial atoms causing the crystal defects are diffused and impurities in the impurity diffusion layer are not diffused.

10. A method for producing a semiconductor device according to claim 2, wherein the high-temperature rapid heat treatment is conducted in a temperature range of about 900° C. to about 1100° C.

11. A method for producing a semiconductor device according to claim 2, wherein an impurity concentration in a vicinity of a surface of a substrate is about $2 \times 10^{17}$ cm$^{-3}$ or less.

12. A method for producing a semiconductor device according to claim 2, wherein a temperature increase rate during the high-temperature heat treatment step is in a range of about 50° C./sec. to about 400° C./sec.

13. A method for producing a semiconductor device according to claim 3, wherein treatment conditions for the high-temperature rapid heat treatment are set in such a manner that interstitial atoms causing the crystal defects are diffused and impurities in the impurity diffusion layer are not diffused.

14. A method for producing a semiconductor device according to claim 3, wherein the high-temperature rapid heat treatment is conducted in a temperature range of about 900° C. to about 1100° C.

15. A method for producing a semiconductor device according to claim 3, wherein an impurity concentration in a vicinity of a surface of a substrate is about $2 \times 10^{17}$ cm$^{-3}$ or less.

16. A method for producing a semiconductor device according to claim 3, wherein a temperature increase rate during the high-temperature heat-treatment step is in a range of about 50° C./sec. to about 400° C./sec.

17. A method for producing a semiconductor device according to claim 4, wherein treatment conditions for the high-temperature rapid heat treatment are set in such a manner that interstitial atoms causing the crystal defects are diffused and impurities in the impurity diffusion layer are not diffused.

18. A method for producing a semiconductor device according to claim 4, wherein the high-temperature rapid heat treatment is conducted in a temperature range of about 900° C. to about 1100° C.

19. A method for producing a semiconductor device according to claim 4, wherein an impurity concentration in a vicinity of a surface of a substrate is about $2 \times 10^{17}$ cm$^{-3}$ or less.

20. A method for producing a semiconductor device according to claim 4, wherein a temperature increase rate during the high-temperature heat treatment step is in a range of about 50° C./sec. to about 400° C./sec.

* * * * *